(12) United States Patent
Park et al.

(10) Patent No.: US 11,222,943 B2
(45) Date of Patent: Jan. 11, 2022

(54) DISPLAY APPARATUS

(71) Applicant: Samsung Display Co., Ltd., Yongin-Si (KR)

(72) Inventors: Gyungsoon Park, Yongin-si (KR); Ilgon Kim, Yongin-si (KR); Minjae Jeong, Yongin-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 16/916,003

(22) Filed: Jun. 29, 2020

(65) Prior Publication Data

US 2020/0335577 A1  Oct. 22, 2020

Related U.S. Application Data

(63) Continuation of application No. 16/734,932, filed on Jan. 6, 2020, now Pat. No. 10,700,158, which is a (Continued)

(30) Foreign Application Priority Data

Mar. 22, 2016 (KR) ........................ 10-2016-0033989

(51) Int. Cl.
*H01L 27/32* (2006.01)
*H01L 51/00* (2006.01)
*H01L 51/52* (2006.01)

(52) U.S. Cl.
CPC ...... *H01L 27/3293* (2013.01); *H01L 27/3244* (2013.01); *H01L 27/3258* (2013.01); (Continued)

(58) Field of Classification Search
CPC ............. H01L 27/3293; H01L 27/3244; H01L 27/3258; H01L 27/326; H01L 51/0097; (Continued)

(56) References Cited

U.S. PATENT DOCUMENTS 7,524,228 B2  4/2009  Imamura
7,619,254 B2  11/2009  Lee et al.
(Continued)

FOREIGN PATENT DOCUMENTS

JP        2008-165251 A   7/2006
KR   10-2006-0057945 A   5/2006
(Continued)

OTHER PUBLICATIONS

European Search Report, Application No. 17161858.1, dated Aug. 2, 2017, 7 pages.

*Primary Examiner* — Peniel M Gumedzoe
(74) *Attorney, Agent, or Firm* — Innovation Counsel LLP

(57) ABSTRACT

A display apparatus includes a substrate; a plurality of display units on the substrate, each including a thin film transistor including at least one inorganic layer, a passivation layer on the thin film transistor, and a display device electrically connected to the thin film transistor; and a plurality of encapsulation layers respectively encapsulating the plurality of display units. The substrate includes a plurality of islands spaced apart, a plurality of connection units connecting the plurality of islands, and a plurality of through holes penetrating through the substrate between the plurality of connection units. The plurality of display units are on the plurality of islands, respectively. The at least one inorganic layer and the passivation layer extend on the plurality of connection units. The passivation layer includes a trench exposing the at least one inorganic layer. The encapsulation layer contacts the at least one inorganic layer exposed via the trench.

16 Claims, 13 Drawing Sheets

Related U.S. Application Data continuation of application No. 16/181,283, filed on Nov. 5, 2018, now Pat. No. 10,529,794, which is a continuation of application No. 15/430,095, filed on Feb. 10, 2017, now Pat. No. 10,121,844.

(52) U.S. Cl.
CPC ...... *H01L 51/0097* (2013.01); *H01L 51/5237* (2013.01); *H01L 51/5246* (2013.01); *H01L 51/5253* (2013.01); *H01L 27/326* (2013.01); *H01L 2251/5338* (2013.01); *Y02E 10/549* (2013.01)

(58) Field of Classification Search
CPC ............. H01L 51/5237; H01L 51/5246; H01L 51/5253; H01L 2251/5338; Y02E 10/549
See application file for complete search history.

(56) References Cited

U.S. PATENT DOCUMENTS

| | | |
|---|---|---|
| 7,682,851 B2 | 4/2010 | Lee et al. |
| 7,719,622 B2 | 5/2010 | Lim |
| 8,552,299 B2 | 10/2013 | Rogers et al. |
| 8,729,524 B2 | 5/2014 | Rogers et al. |
| 9,065,077 B2 | 6/2015 | Hung et al. |
| 9,252,395 B2 | 2/2016 | Oh |
| 9,450,125 B2 | 9/2016 | Lee |
| 9,536,860 B2 | 1/2017 | Yoon et al. |
| 2008/0157235 A1 | 7/2008 | Rogers et al. |
| 2013/0041235 A1 | 2/2013 | Rogers et al. |
| 2014/0028686 A1 | 1/2014 | He et al. |
| 2014/0340857 A1 | 11/2014 | Hsu et al. |
| 2014/0374759 A1 | 12/2014 | Kim et al. |
| 2015/0090995 A1 | 4/2015 | Jung et al. |
| 2016/0049602 A1 | 2/2016 | Kim |
| 2016/0268352 A1 | 9/2016 | Hong et al. |
| 2017/0288168 A1 | 10/2017 | Kim et al. |

FOREIGN PATENT DOCUMENTS

| | | |
|---|---|---|
| KR | 10-0707210 B1 | 4/2007 |
| KR | 10-2008-073942 A | 8/2008 |
| KR | 10-2013-0141399 A | 12/2013 |
| KR | 10-1404472 B1 | 6/2014 |
| KR | 10-2015-0059196 A | 6/2015 |
| KR | 10-2015-0135721 A | 12/2015 |
| KR | 10-2016-0020034 A | 2/2016 |
| KR | 10-2016-0118459 A | 10/2016 |
| TW | 200618311 A | 6/2006 |
| TW | 200623426 A | 7/2006 |

DISPLAY APPARATUS

CROSS-REFERENCE TO RELATED PATENT APPLICATION(S)

This application is a continuation of U.S. patent application Ser. No. 16/734,932 filed Jan. 6, 2020, which is a continuation of U.S. patent application Ser. No. 16/181,283 filed Nov. 5, 2018 (now issued to U.S. Pat. No. 10,529,794), which is a continuation application of U.S. patent application Ser. No. 15/430,095 filed on Feb. 10, 2017 (now issued to U.S. Pat. No. 10,121,844), which claims priority to and the benefit of Korean Patent Application No. 10-2016-0033989, filed on Mar. 22, 2016, in the Korean Intellectual Property Office, the disclosures of which are incorporated herein in their entirety by reference.

BACKGROUND

1. Field

The present disclosure relates to a display apparatus.

2. Description of the Related Art

As the display technology develops rapidly, various flat panel display apparatuses having excellent characteristics such as a slim profile, a light weight, and low power consumption have been introduced. With the recent development in display technology, flexible display apparatuses have been researched and developed, and stretchable display apparatuses that are capable of being changed to various shapes are being actively researched and developed.

Meanwhile, a display apparatus having a slim profile and flexible characteristics may include a thin film encapsulation layer to block infiltration of moisture, oxygen, etc. from outside. A conventional thin film encapsulation layer has a configuration in which inorganic layers and organic layers are alternately stacked. However, since the thin film encapsulation layer is integrally formed with a display apparatus, the thin film encapsulation layer may degrade the flexibility of the display apparatus, and the thin film encapsulation layer may be damaged when the shape of the display apparatus is changed.

SUMMARY

One or more embodiments of the present disclosure provide a display apparatus.

Additional aspects will be set forth in part in the description which follows and, in part, will be apparent from the description, or may be learned by practice of the presented embodiments.

According to one or more embodiments, a display apparatus includes a substrate; a plurality of display units disposed on the substrate, each including a thin film transistor including at least one inorganic layer, a passivation layer disposed on the thin film transistor, and a display device electrically connected to the thin film transistor; and a plurality of encapsulation layers respectively encapsulating the plurality of display units, wherein the substrate includes a plurality of islands spaced apart from one another, a plurality of connection units that are connecting the plurality of islands to one another, and a plurality of through holes penetrating through the substrate between the plurality of connection units, the plurality of display units are disposed on the plurality of islands, respectively, the at least one inorganic layer and the passivation layer extend on the plurality of connection units, the passivation layer includes a trench that exposes a portion of the at least one inorganic layer, and the encapsulation layer contacts an exposed portion of the at least one inorganic layer via the trench.

The trench may be disposed on a connection unit of the plurality of connection units.

The trench may extend across a width of the connection unit and may be aligned with a lateral surface of an island of the plurality of islands.

The trench may be on an island of the plurality of islands and may completely surround a display unit of the plurality of display units.

The at least one inorganic layer may include a first insulating layer between an active layer and a gate electrode of the thin film transistor, and a second insulating layer disposed on the gate electrode. The trench may expose a portion of the first insulating layer or the second insulating layer.

The encapsulation layer may contact a lateral surface of an island of the plurality of islands.

The encapsulation layer may include at least one of tin fluorophosphates glass, chalcogenide glass, tellurite glass, borate glass, and phosphate glass.

Each of the plurality of encapsulation layers may include at least one inorganic layer and at least one organic layer. The at least one inorganic layer may contact an exposed portion of the at least one inorganic layer of the thin film transistor via the trench.

At least one of the at least one inorganic layer and the at least one organic layer may include silicon oxide including carbon and hydrogen.

Each of the plurality of encapsulation layers may include a first inorganic layer, a second inorganic layer, and an organic layer between the first inorganic layer and the second inorganic layer. At least one of the first inorganic layer and the second inorganic layer may contact a lateral surface of the island and may contact an exposed portion of the at least one inorganic layer of the thin film transistor via the trench.

A connection unit of the plurality of connection units may include flexures disposed on at least a portion of the connection unit, and the second inorganic layer disposed on an outermost side of the encapsulation layer from among the first inorganic layer and the second inorganic layer may extend over the flexures.

Each of the plurality of display units may include a display region and a non-display region around the display region, and a dam unit surrounding at least a portion of the display region may be disposed in the non-display region. The first inorganic layer and the second inorganic layer may cover the dam unit and contact each other around the dam unit.

The thin film transistor may include an active layer, a gate electrode, a source electrode, and a drain electrode. The display device may include a first electrode, a second electrode, and an intermediate layer including an organic emission layer between the first electrode and the second electrode. The first electrode may extend from one of the source electrode and the drain electrode. Each of the plurality of display units may be disposed between the first electrode and the island and may further include a color filter including a portion overlapped by the first electrode.

The plurality of islands and the plurality of connection units may be one body.

The plurality of islands may be repeated in a first direction and a second direction that is different from the first direction. Four connection units may be connected to each of the plurality of islands. Four connection units connected to one island from among the plurality of islands may extend in different directions and may be respectively connected to four adjacent islands that surround the one island.

The four connection units may include a pair of first connection units on opposite sides of the one island and each extending in the first direction, and a pair of second connection units on opposite sides of the one island and each extending in the second direction. A first wiring unit may be disposed on the two first connection units, and a second wiring unit may be disposed on the two second connection units. The first wiring unit and the second wiring unit may cross on the one island.

The first wiring unit may include a region curved in the second direction along a through hole of the plurality of through holes, and the second wiring unit may include a region curved in the first direction along the through hole.

The thin film transistor may include an active layer, a gate electrode, a source electrode, and a drain electrode. The source electrode, the drain electrode, the first wiring unit, and the second wiring unit may include a same material.

The first wiring unit may include a first voltage line, a second voltage line, and at least one data line, and the second wiring unit may include at least one scan line.

The display device may include a first electrode, a second electrode, and an intermediate layer between the first electrode and the second electrode and including an organic emission layer. The first voltage line may electrically connect first electrodes respectively included in the plurality of display units and separated from one another to one another. The second voltage line may electrically connect second electrodes respectively included in the plurality of display units and separated from one another to one another.

Two adjacent islands among the plurality of islands may be connected to each other by one connection unit. Each of the two adjacent islands connected to the one connection unit and a direction in which the one connection unit extends may make an acute angle.

Each of the plurality of islands may have a quadrilateral shape, and four corners of each of the plurality of islands may be directed in the first direction and the second direction.

The display apparatus may further include a first protection film and a second protection film respectively disposed on an upper surface and a lower surface of the substrate. The first protection film and the second protection film may include elongation sheets.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
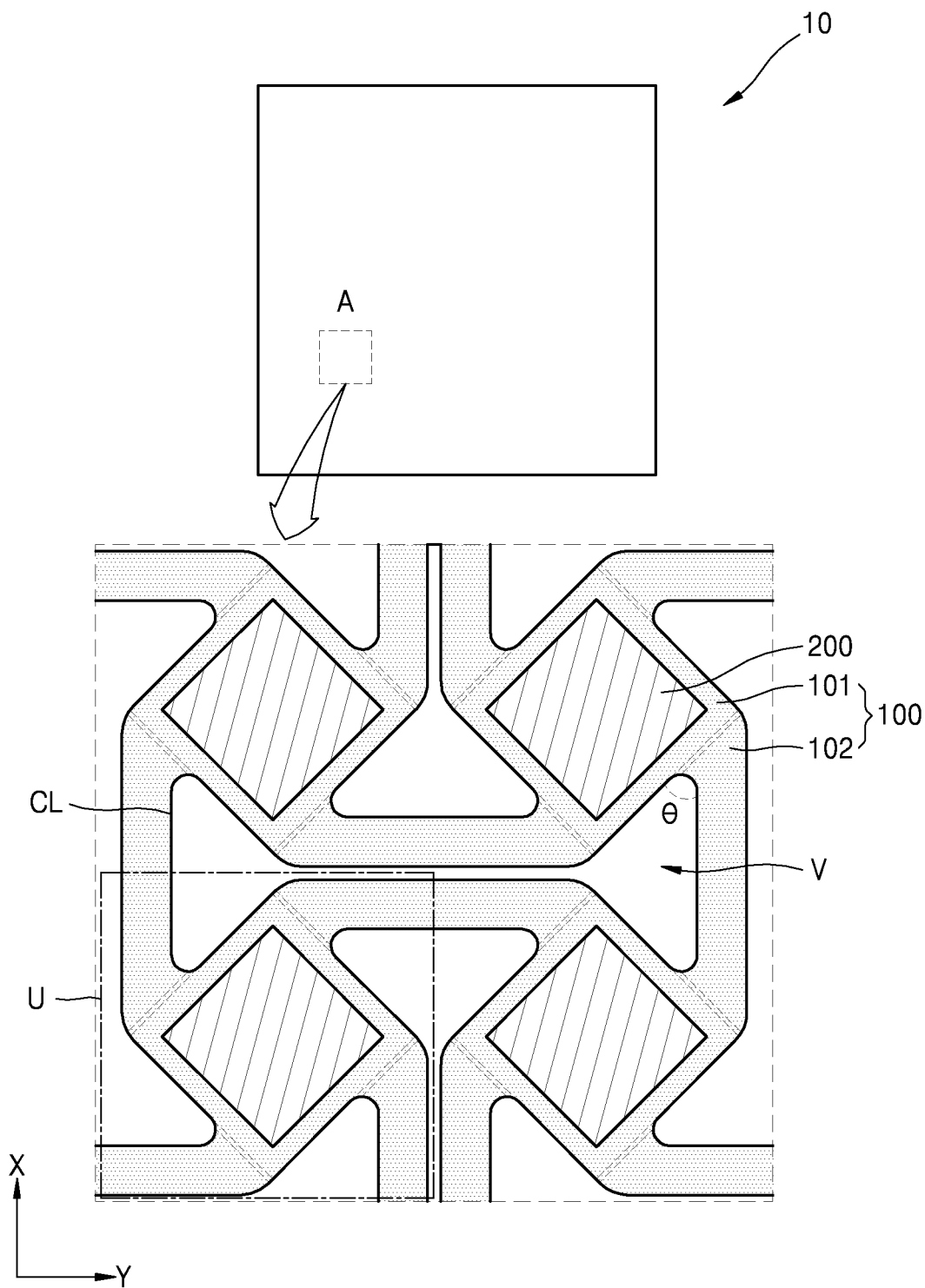
FIG. 1 is a schematic plan view of a display apparatus, according to an embodiment of the present disclosure.

The present disclosure allows for various changes and numerous embodiments, and particular embodiments will be illustrated in the drawings and described in detail in the written description. However, this is not intended to limit the scope of the present disclosure to particular modes of practice, and it is to be appreciated that all changes, equivalents, and substitutes that do not depart from the spirit and technical scope of the present disclosure are encompassed in the present disclosure. In the following description of the present disclosure, a detailed description of disclosed embodiments is provided to clarify exemplary features of the present disclosure.

While such terms as "first", "second", etc., may be used to describe various components, such components must not be limited to the above terms. The above terms may be used to distinguish one component from another.

The terms used in the present specification are merely used to describe particular embodiments, and are not intended to limit the scope of the present disclosure. An expression used in a singular encompasses the expression in a plural, unless it has a clearly different meaning in the context. In the drawings, components may be exaggerated, omitted, or schematically illustrated for convenience and clarity of explanation. In other words, sizes and thicknesses of components in the drawings may not reflect actual sizes and thicknesses thereof.

One or more embodiments of the present disclosure will be described below in more detail with reference to the accompanying drawings. Those components that are the same or are in correspondence are rendered the same reference numeral regardless of the figure number, and redundant explanations may be omitted.

Figure 2:
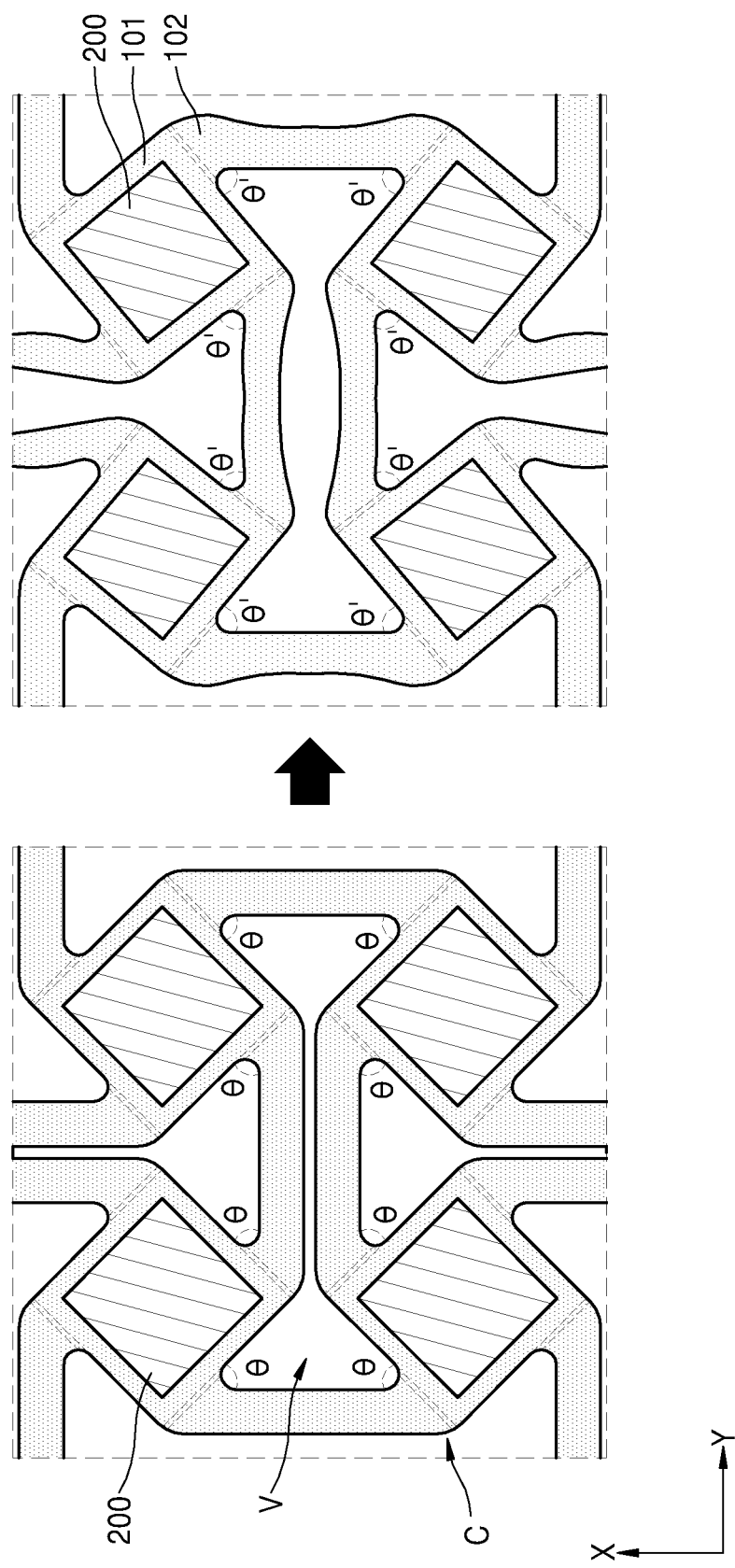
FIG. 2 is a magnified plan view of a portion A of FIG. 1, according to an embodiment.

FIG. 1 is a schematic plan view of a display apparatus 10, according to an embodiment of the present disclosure, and FIG. 2 is a magnified plan view of a portion A of FIG. 1, according to an embodiment.

Referring to FIG. 1, the display apparatus 10 may include a substrate 100 and display units 200 on the substrate 100.

The substrate 100 may include various materials. The substrate 100 may include a material, such as glass, metal, or an organic material.

According to another embodiment, the substrate 100 may include a flexible material. For example, the substrate 100 may include a material that can be easily bent, folded, or rolled. The flexible substrate 100 may include a flexible material such as ultra-thin glass, metal, or plastic. When the substrate 100 includes plastic, the substrate 100 may include polyimide (PI). As another example, the substrate 100 may include another type of plastic material.

The substrate 100 may include a plurality of islands 101 spaced apart from one another, a plurality of connection units 102 that are connecting the plurality of islands 101 to one another, and a plurality of through holes V penetrating through the substrate 100 between the plurality of connection units 102. As will be described with reference to FIG. 18, a first protection film 410 and a second protection film 420 may be respectively disposed on an upper surface and a lower surface of the substrate 100.

The plurality of islands 101 may be arranged to be spaced apart from one another. For example, the plurality of islands 101 may be repeated in a first direction X and a second direction Y that is different from the first direction X to form a planar lattice pattern. For example, the first direction X and the second direction Y may intersect at 90° angle. As another example, the first direction X and the second direction Y may meet at either an acute or an obtuse angle.

A plurality of display units 200 may be disposed on the plurality of islands 101, respectively. Each display unit 200 may include at least a display device to realize visible light. Each display unit 200 will be described below in detail with reference to FIG. 4.

The plurality of connection units 102 may connect the plurality of islands 101 to one another. For example, four connection units 102 of each of the island 101 are extended to be connected to each of the adjacent islands 101 in different directions such that the four connection units 102 may be respectively connected to the four adjacent islands 101 surrounding the island 101. The plurality of islands 101 and the plurality of connection units 102 may be formed of the same material and may be connected to each other. In other words, the plurality of islands 101 and the plurality of connection units 102 may be integrally formed with each other.

The through holes V penetrate through the substrate 100. The through holes V may provide separation areas between the plurality of islands 101, reducing the weight of the substrate 100 while improving the flexibility of the substrate 100. When the substrate 100 is bent, rolled, or the like, the shapes of the through holes V change to effectively reduce the stress generated during deformation of the substrate 100. Thus, abnormal deformation and stress concentration of the substrate 100 under deformation may be prevented, and durability of the substrate 100 may improve.

The through holes V may be formed by removing selective regions of the substrate 100 via etching or the like. As another example, the substrate 100 may be manufactured to include the through holes V during the manufacture of the substrate 100. As another example, after the plurality of display units 200 are formed on the substrate 100, the through holes V may be formed by patterning the substrate 100. The through holes V may be formed in the substrate 100 in various ways, and a method of forming the through holes V may not be limited to the examples described herein.

Hereinafter, a unit U refers to the basic unit of the substrate 100, and a structure of the substrate 100 will be described in more detail with reference to the unit U.

The unit U may be repeated in the first direction X and the second direction Y. In other words, the substrate 100 may be understood as a combination of a plurality of units U repeated in the first direction X and the second direction Y. Each unit U may include an island 101 and at least one connection unit 102 connected to the island 101. For example, four connection units 102 may be connected to one island 101.

The islands 101 of two adjacent units U may be spaced apart from each other, and connection units 102 of the two adjacent units U may be connected to each other. A connection unit 102 included in a unit U may be referred to as a partial region of the connection unit 102 that is within the unit U or may be referred to as the whole of a connection unit 102 between two adjacent islands 101 that connects the two adjacent islands 101 to each other.

Four adjacent units U among the plurality of units U form closed curves CL between the four units U, and the closed curves CL may define an empty space herein referred to as a through hole V. The through hole V may also be referred to as a separation area V. The separation area is formed by removing one region of the substrate 100, and may improve the flexibility of the substrate 100 while reducing stress that is generated when the substrate 100 is deformed. Each connection unit 102 may have a smaller width than a width of each island 101, and the separation area may contact the islands 101 of the four units U.

Two adjacent units U among the plurality of units U may be symmetrical to each other. In detail, as shown in FIG. 1, one unit U may be symmetrical to another unit U adjacent to the one unit U in the second direction Y, about an axis of symmetry that is parallel to the first direction X. At the same time, one unit U may be symmetrical to another unit U adjacent to the one unit U in the first direction X, about an axis of symmetry that is parallel to the second direction Y.

An angle θ between a direction in which a connection unit 102 extends and a lateral surface of an island 101 to which the connection unit 102 is connected may be an acute angle. For example, when each island 101 is a quadrilateral and is disposed such that each of the four corners thereof is directed in the first direction X or the second direction Y, the connection units 102 may be connected to the island 101 at regions adjacent to the four corners and may extend in a direction parallel to the second direction Y or the first direction X. In other words, the connection units 102 connected to the corners directed to the first direction X may be directed in the second direction Y or a direction −Y that is opposite to the second direction Y, and the connection units 102 connected to the corners directed in the second direction Y may be directed in the first direction X or a direction −X that is opposite to the first direction X.

Thus, each of the lateral surfaces of two adjacent islands 101 connected to one connection unit 102 may respectively make acute angles with the direction in which the connection unit 102 extends. Accordingly, the islands 101 may be densely arranged, and the areas of the separation areas may be maximized by minimizing the lengths of the connection units 102. As shown in FIG. 2, the substrate 100 may exhibit an elongation property.

FIG. 2 illustrates a shape of the substrate 100 before and after the substrate 100 is elongated both in the first direction X and the second direction Y. Referring to FIG. 2, when the substrate 100 is elongated, the angles formed by the connection units 102 and the lateral surfaces of the islands 101 to which the connection units 102 are connected increase ($\theta<\theta'$), and thus the separation areas may enlarge. Accordingly, intervals between the islands 101 may increase, and thus the substrate 100 may be elongated both in the first direction X and the second direction Y.

Since each connection unit 102 has a smaller width than a width of each island 101, a shape change corresponding to the increase of the angle $\theta$ while an external force is applied to the substrate 100 may mainly occur in the connection units 102, and the shapes of the islands 101 may not substantially change during elongation of the substrate 100. Thus, the display units 200 on the islands 101 may be stably maintained even when the substrate 100 is elongated, and accordingly the display apparatus 10 may be suited for display apparatuses that require flexibility, for example, bending display apparatuses, flexible display apparatuses, or stretchable display apparatuses.

Moreover, since stress concentrates on connecting portions of the connection units 102 that are connected to the lateral surfaces of the islands 101 during elongation of the substrate 100, connecting regions C of the connection units 102 may include curved surfaces to prevent tearing or the like of the connection units 102 due to the concentration of the stress.

Figure 3:
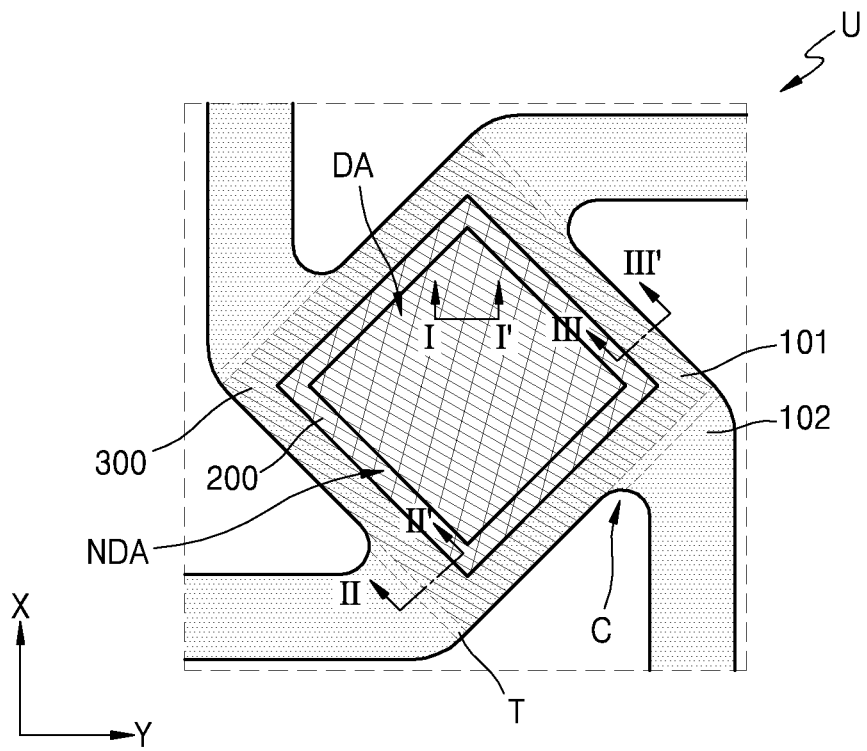
FIG. 3 is a schematic plan view of a unit of FIG. 1, according to an embodiment.
Figure 4:
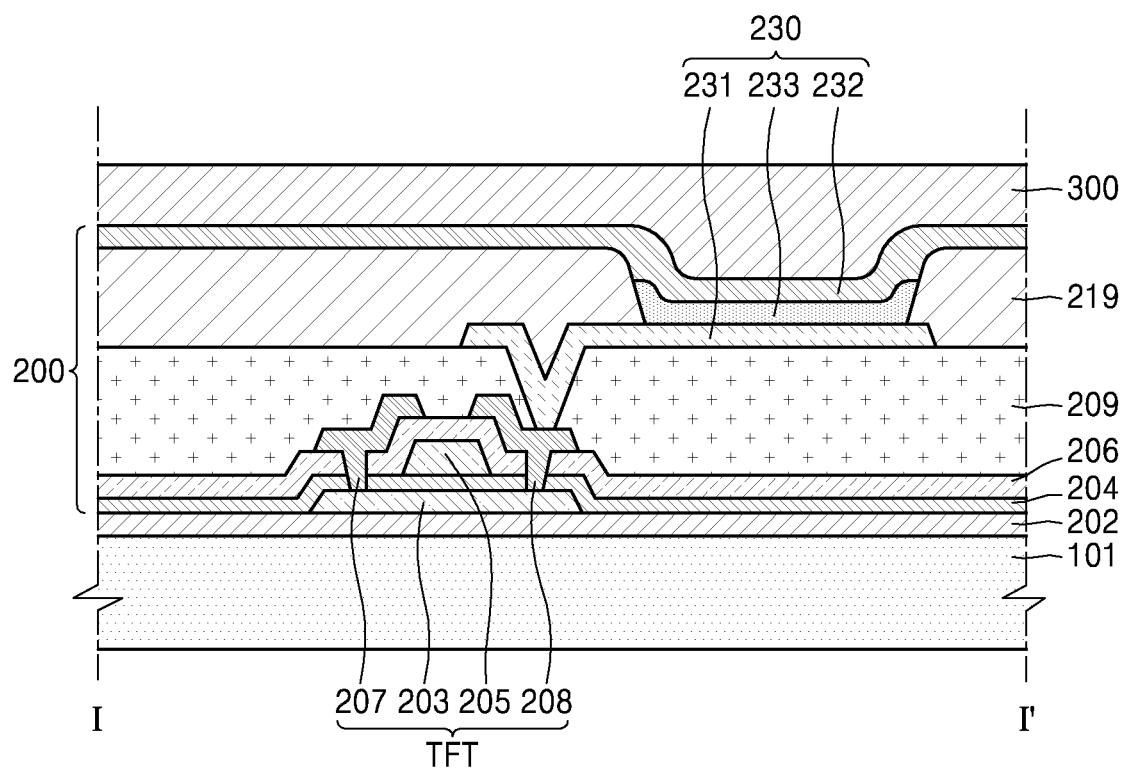
FIG. 4 is a cross-sectional view taken along line I-I' of FIG. 3, according to an embodiment.
Figure 5:
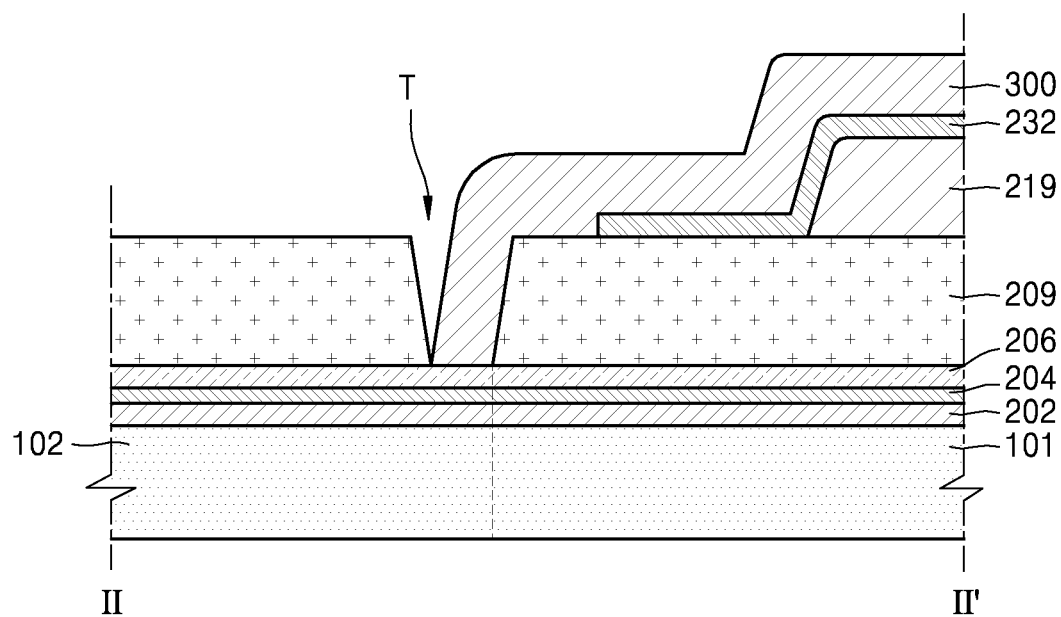
FIG. 5 is a cross-sectional view taken along line II-II' of FIG. 3, according to an embodiment.
Figure 6:
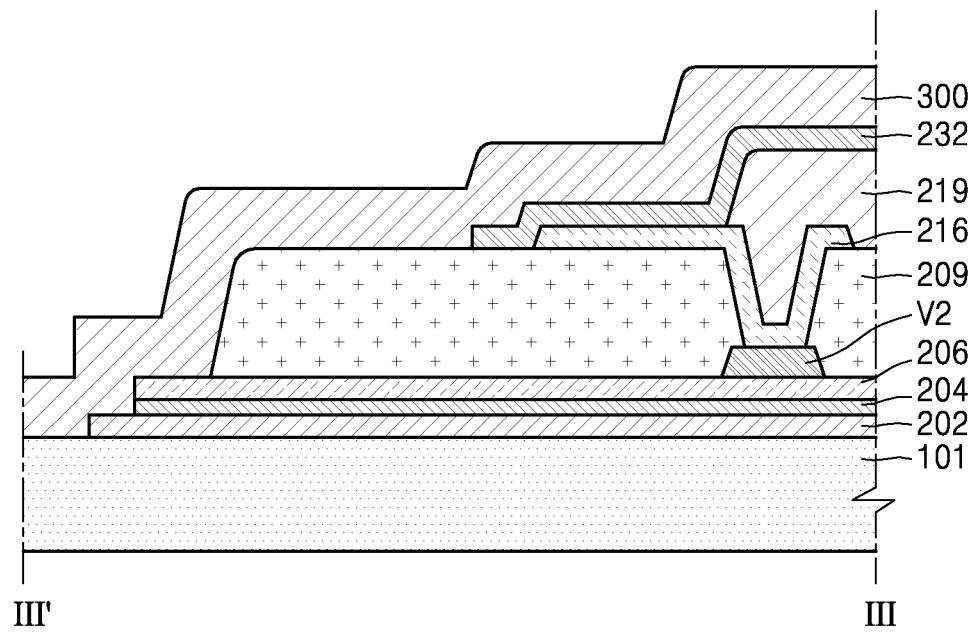
FIG. 6 is a cross-sectional view taken along line III-III' of FIG. 3, according to an embodiment.
Figure 7:
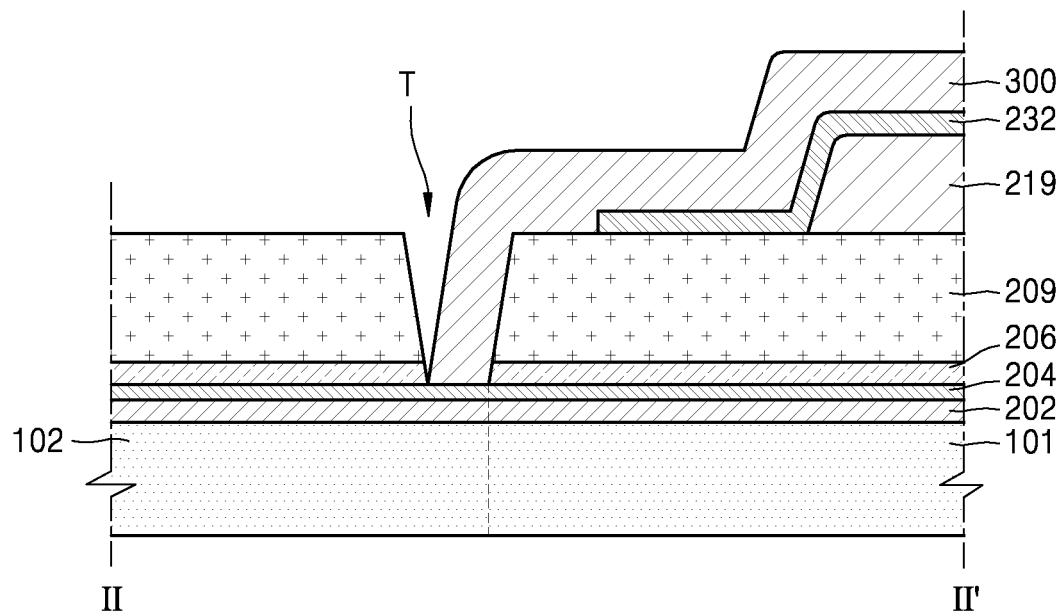
FIG. 7 is a cross-sectional view taken along line II-II' of FIG. 3, according to another embodiment.
Figure 8:
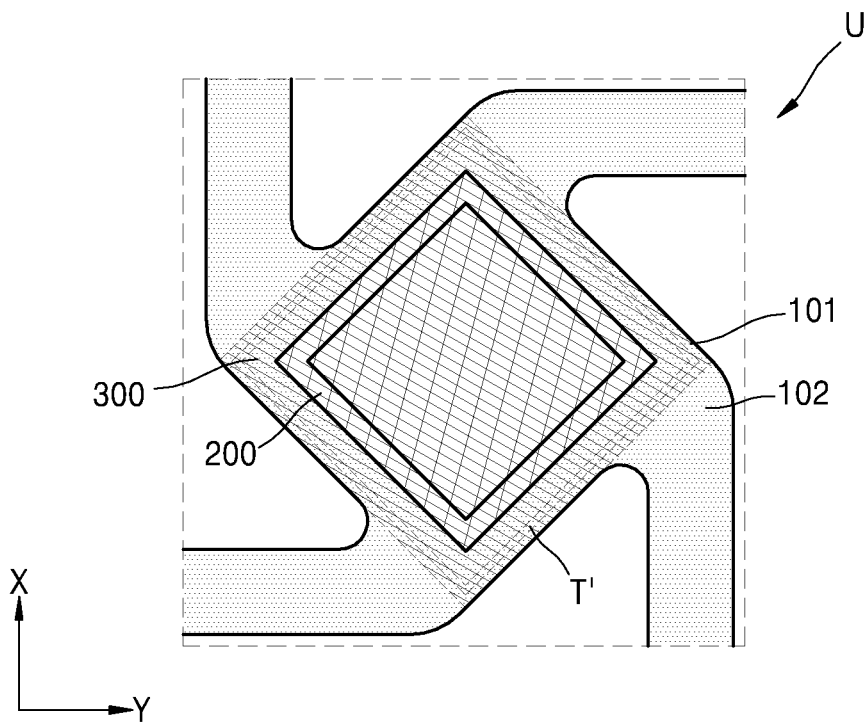
FIG. 8 is a schematic plan view of a unit of FIG. 1, according to another embodiment.

FIG. 3 is a schematic plan view of a unit U of FIG. 1, FIG. 4 is a cross-sectional view taken along line I-I' of FIG. 3, FIG. 5 is a cross-sectional view taken along line II-II' of FIG. 3, and FIG. 6 is a cross-sectional view taken along line III-III' of FIG. 3, according to an embodiment. FIG. 7 is a cross-sectional view taken along line II-II' of FIG. 3, according to another embodiment. FIG. 8 is a schematic plan view of another example of a unit U of FIG. 1.

Referring to FIGS. 3-8, a display unit 200 and an encapsulation layer 300 encapsulating the display unit 200 may be on an island 101 of a unit U.

The display unit 200 may be located on the island 101 and may include a display region DA and a non-display region around the display region DA. In the display region DA, at least one organic light-emitting device 230 emitting, for example, red (R), blue (B), green (G), or white (W) light, may be located. Herein, the organic light-emitting device 230 may be referred to and described as the display device. However, embodiments of the present disclosure are not limited thereto, and the display unit 200 may include various other types of display devices, such as a liquid crystal display.

The display unit 200 may include one organic light-emitting device 230 emitting red (R), blue (B), green (G), or white (W) light, and thus one display unit 200 may form one sub-pixel. As another example, the display unit 200 may include a plurality of organic light-emitting devices 230 that emit different lights. For example, one display unit 200 may form a pixel by including an organic light-emitting device 230 emitting red (R) light, an organic light-emitting device 230 emitting green (G) light, and an organic light-emitting device 230 emitting blue (B) light. As another example, the display unit 200 may include a plurality of pixels.

Organic light-emitting devices 230 within the display unit 200 may be arranged in various configurations, such as an RGB configuration, a pentile structure, and a honeycomb structure, depending on the efficiency of a material included in an organic emission layer.

Referring to FIG. 4, a buffer layer 202 may be formed on the island 101. For example, the buffer layer 202 may be formed of an inorganic material (e.g., silicon oxide, silicon nitride, silicon oxynitride, aluminum oxide, aluminum nitride, titanium oxide, and titanium nitride), an organic material (e.g., polyimide, polyester, and acryl), or stacks of inorganic and organic materials. The buffer layer 102 may be formed on both the island 101 and the connection unit 102.

A thin film transistor TFT may include an active layer 203, a gate electrode 205, a source electrode 207, and a drain electrode 208. A case of a top gate type thin film transistor TFT in which the active layer 203, the gate electrode 205, the source electrode 207, and the drain electrode 208 are sequentially formed in the stated order will now be described. However, the present embodiment is not limited thereto, and various types of thin film transistors TFT, such as a bottom gate type thin film transistor TFT, may be employed.

The active layer 203 may include a semiconductor material, for example, amorphous silicon or polycrystalline silicon. However, the present embodiment is not limited thereto, and the active layer 203 may include various materials. According to another embodiment, the active layer 203 may include an organic semiconductor material or the like. According to another embodiment, the active layer 203 may include an oxide semiconductor material. For example, the active layer 203 may include an oxide of a material selected from Group 12, 13, and 14 metal elements (e.g., zinc (Zn), indium (In), gallium (Ga), stannum (Sn), cadmium (Cd), and germanium (Ge)) and a combination thereof.

A first insulating layer 204 may be formed on the active layer 203. The first insulating layer 204 may be formed of an inorganic material, such as silicon oxide and/or silicon nitride, in a multi-layer structure or a single-layer structure. The first insulating layer 204 insulates the active layer 203 from the gate electrode 205. The first insulating layer 204 may be formed on both the island 101 and the connection unit 102.

The gate electrode 205 may be formed on the first insulating layer 204 to overlap the active layer 203. The gate electrode 205 may be connected to a gate line (not shown) that applies an ON/OFF signal to the thin film transistor TFT. The gate electrode 205 may include a low resistance metal material. The gate electrode 205 may be formed of at least one of aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or a multi-layered structure.

A second insulating layer 206 may be formed on the gate electrode 205 and the first insulating layer 204. The second insulating layer 206 insulates the source electrode 207 and the drain electrode 208 from the gate electrode 205. The second insulating layer 206 may be formed of an inorganic material in a multi-layer structure or a single-layer structure. For example, the inorganic material may be metal oxide or metal nitride. In detail, the inorganic material may include silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), zirconium oxide ($ZrO_2$), or the like.

According to another embodiment, the second insulating layer 206 may be a single layer formed of an organic material, or may be a multi-layer structure including a plurality of organic material layers. The organic material may include a commercial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. A passivation layer 209 may be a stack of an inorganic insulation layer and an organic insulation layer.

The second insulating layer 206 may be formed on both the island 101 and the connection unit 102.

The source electrode 207 and the drain electrode 208 are formed on the second insulating layer 206. The source electrode 207 and the drain electrode 208 may be formed of at least one selected from a group including aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and copper (Cu) in a single-layered or a multi-layered structure. The source electrode 207 and the drain electrode 208 contact the active layer 203 via contact holes formed in the second insulating layer 206 and the first insulating layer 204.

The passivation layer 209 may cover the thin film transistor TFT. The passivation layer 209 may planarize steps caused by the thin film transistor TFT, thereby preventing the organic light-emitting device 230 from being damaged by unevenness.

The passivation layer 209 may be a single layer formed of an organic material, or may be a multi-layer structure including a plurality of organic material layers. The organic material may include a commercial polymer such as PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The passivation layer 209 may be a stack of an inorganic insulation layer and an organic insulation layer.

The passivation layer 209 may be formed on both the island 101 and the connection unit 102. The passivation layer 209 on the connection unit 102 may include a trench T exposing an inorganic layer under the passivation layer 209. The inorganic layer that is exposed under the passivation layer 209 may be the buffer layer 202, the first insulating layer 204, and/or the second insulating layer 206.

The trench T may extend across the width of the connection unit 102. Accordingly, the trench T may reduce or prevent infiltration of external moisture into the display unit 200 via the passivation layer 209 formed of an organic material.

For example, as shown in FIG. 3, the trench T may extend across the width of the connection unit 102, in a connecting region C where the island 101 and the connection unit 102 are connected to each other, and may be aligned with a lateral surface of the island 101. In detail, an extension of the lateral surface of the island 101 may be within the width of the trench T.

As another example, as shown in FIG. 8, a trench T' may be disposed on the island 101 to completely surround the display unit 200. Accordingly, separate passivation layers 209 may be formed on each of the islands 101, respectively.

The organic light-emitting device 230 is formed on the passivation layer 209. The organic light-emitting device 230 may include a first electrode 231, a second electrode 232 opposite to the first electrode 231, and an intermediate layer 233 between the first electrode 231 and the second electrode 232.

The first electrode 231 may be electrically connected to either the source electrode 207 or the drain electrode 208. The first electrode 231 may have various shapes. For example, the first electrode 231 may be patterned to have an island shape.

The first electrode 231 may be formed on the passivation layer 209 and may be electrically connected to the thin film transistor TFT via a contact hole formed in the passivation layer 209. For example, the first electrode 231 may be a reflection electrode including a reflection layer formed of silver (Ag), magnesium (Mg), aluminum (Al), platinum (Pt), palladium (Pd), gold (Au), nickel (Ni), neodymium (Nd), iridium (Ir), chromium (Cr), or a compound thereof. In another example, the first electrode 231 may include a transparent electrode layer on the reflection layer. The transparent electrode layer may include at least one selected from a group including indium tin oxide (ITO), indium zinc oxide (IZO), zinc oxide (ZnO), indium oxide ($In_2O_3$), indium gallium oxide (IGO), and aluminum zinc oxide (AZO).

The second electrode 232 may be electrically connected to a second voltage line V2 and may receive a second voltage ELVSS that is lower than a first voltage ELVDD that is applied to the first electrode 231. Although the second voltage line V2 and the second electrode 232 are shown to be connected to each other via a connection line 216 shown in FIG. 6, embodiments of the present disclosure are not limited thereto. For example, the second voltage line V2 and the second electrode 232 may directly contact each other.

The second electrode 232 may have various shapes. For example, the second electrode 232 may be patterned to have an island shape. Thus, a portion of the second electrode 232 may be prevented from being exposed even when the second electrode 232 is completely covered with the encapsulation layer 300, and encapsulation layers 300 are respectively formed on the islands 101.

The second electrode 232 may be a transparent electrode. The second electrode 232 may include a metal thin film including Li, Ca, LiF/Ca, LiF/Al, Al, Ag, Mg, or a combination thereof. An auxiliary electrode layer or a bus electrode may be further formed on the metal thin film. The auxiliary electrode layer or the bus electrode may include a material such as ITO, IZO, ZnO, or $In_2O_3$. Accordingly, the second electrode 232 may transmit light emitted by an organic emission layer included in the intermediate layer 233. In other words, the light emitted by the organic emission layer may travel directly toward the second electrode 232, or may be reflected by the first electrode 231 that is formed as the reflection electrode and then travel toward the second electrode 232.

In the example described above with reference to FIGS. 3-8, the display unit 200 is of a top-emission type. However, the display unit 200 according to another embodiment is not limited to the top-emission type. According to another embodiment, the display unit 200 may be a bottom-emission type in which the light emitted by the organic emission layer is emitted toward the island 101. In this case, the first electrode 231 may be a transparent electrode, and the second electrode 232 may be a reflection electrode. The display unit 200 according to yet another embodiment may be of a dual emission type that emits light in both directions toward the top surface and the bottom surface of the display unit 200.

A pixel defining layer 219 including an insulating material is formed on the first electrode 231. The pixel defining layer 219 may be formed of at least one organic insulating material selected from the group including polyimide, polyamide (PA), acryl resin, benzocyclobutene (BCB) and a phenolic resin, by using a method such as spin coating. The pixel defining layer 219 exposes an area of the first electrode 231. The intermediate layer 233 including an organic emission layer is formed on the exposed area of the first electrode 231. In other words, the pixel defining layer 219 defines a pixel region of an organic light-emitting device.

The intermediate layer 233 may further include one or more functional layers, such as a hole transport layer (HTL), a hole injection layer (HIL), an electron transport layer (ETL), and an electron injection layer (EIL), in addition to the organic emission layer.

The encapsulation layer 300 encapsulating the display unit 200 may be formed on the second electrode 232. The encapsulation layer 300 may block external oxygen and moisture and may include a single layer or a plurality of layers.

The encapsulation layer 300 may include at least one of an organic layer and an inorganic layer.

The organic layer may include PMMA, polycarbonate (PC), PS, acryl-based resin, epoxy-based resin, polyimide, and/or polyethylene. The inorganic layer may include at least one selected from a group including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

According to another embodiment, the encapsulation layer 300 may include a Low temperature Viscosity Transition (LVT) inorganic material. A viscosity transition temperature denotes a minimum temperature at which fluidity can be provided to an LVT inorganic material. The viscosity transition temperature may be less than a denaturalization temperature of a material included in the organic light-emitting device 230.

The LVT inorganic material may be, for example, a low liquidus temperature (LLT) material having a glass transition temperature of 200° C. or less. In more detail, an LLT material may include at least one of tin fluorophosphates glass, chalcogenide glass, tellurite glass, borate glass, and phosphate glass.

For example, the tin fluorophosphates glass may include, but is not limited to, Sn of 20-80% by weight, phosphorus (P) of 2-20% by weight, oxygen (O) of 3-20% by weight, and fluorine (F) of 10-36% by weight. The aforementioned glass materials may further include tungsten (W). When tungsten (W) is added to a glass material, a more stable and uniform glass can be produced, and thus the encapsulation layer 300 may have improved chemical durability.

The LVT inorganic material may include Sn oxide (e.g., SnO or $SnO_2$). For example, when the LVT inorganic material includes SnO, SnO content may be 20% to 100% by weight.

The LVT inorganic material including Sn oxide may further include, but is not limited to, at least one of P oxide (e.g., $P_2O_5$), boron (B) phosphate ($BPO_4$), Sn fluoride (e.g., $SnF_2$), niobium oxide (e.g., NbO), and W oxide (e.g., $WO_3$).

For example, the LVT inorganic material may include, but is not limited to, SnO; SnO and $P_2O_5$; SnO and $BPO_4$; SnO, $SnF_2$ and $P_2O_5$; SnO, $SnF_2$, $P_2O_5$ and NbO; or SnO, $SnF_2$, $P_2O_5$ and $WO_3$.

The LVT inorganic material may have, but is not limited to, any of the following compositions:

1 SnO (100 wt %);
2 SnO (80 wt %) and $P_2O_5$ (20 wt %);
3 SnO (90 wt %) and $BPO_4$ (10 wt %);
4 SnO (20-50 wt %), $SnF_2$ (30-60 wt %) and $P_2O_5$ (10-30 wt %) (where a sum of the weights of SnO, $SnF_2$, and $P_2O_5$ is 100 wt %);
5 SnO (20-50 wt %), $SnF_2$ (30-60 wt %), $P_2O_5$ (10-30 wt %) and NbO (1-5 wt %) (where a sum of the weights of SnO, $SnF_2$, $P_2O_5$ and NbO is 100 wt %); or
6 SnO (20-50 wt %), $SnF_2$ (30-60 wt %), $P_2O_5$ (10-30 wt %) and $WO_3$ (1-5 wt %) (where a sum of the weights of SnO, $SnF_2$, $P_2O_5$ and $WO_3$ is 100 wt %).

Since such an encapsulation layer 300 is formed of a glass material, even when the encapsulation layer 300 does not include a plurality of layers, the encapsulation layer 300 may effectively prevent infiltration of external moisture and oxygen.

The encapsulation layer 300 may be formed on one island 101 to encapsulate one display unit 200. In other words, when the display apparatus 10 of FIG. 1 includes N display units 200, N encapsulation layers 300 may be formed. Thus, the encapsulation layer 300 is prevented from being damaged, for example, cracked, when the display apparatus 10 is elongated or when the display apparatus 10 is deformed due to bending, rolling, or the like, thereby improving the reliability and flexibility of the display apparatus 10.

The encapsulation layer 300 may contact an exposed portion of an inorganic layer of the display unit 200 in the non-display region of the display unit 200. In this case, the inorganic layer of the display unit 200 may be at least one of the buffer layer 202, the first insulating layer 204, and the second insulating layer 206. The encapsulation layer 300 may further extend beyond the island 101 and may contact the lateral surface of the island 101. Thus, the encapsulation layer 300 may effectively prevent infiltration of external moisture and/or oxygen.

The encapsulation layer 300 may contact the exposed portion of the inorganic layer including at least one of the buffer layer 202, the first insulating layer 204, and the second insulating layer 206 via the trench T.

For example, as shown in FIG. 5, when the second insulating layer 206 is formed of an inorganic material, the encapsulation layer 300 may contact an exposed portion of the second insulating layer 206 via the trench T. As another example, as shown in FIG. 7, when the second insulating layer 206 is formed of an organic material and the first insulating layer 204 below the second insulating layer 206 is formed of an inorganic material, a trench T may be formed to expose a portion of the first insulating layer 204, and the encapsulation layer 300 may contact the exposed portion of the first insulating layer 204 via the trench T.

The trench T may be aligned with the lateral surface of the island 101. The display unit 200 is entirely surrounded and encapsulated by the encapsulation layer 300 and the inorganic layer having an isolated state, therefore infiltration of external moisture and/or oxygen into the display unit 200 may be effectively reduced or prevented.

As another example, as shown in FIG. 8, when the trench T' is formed on the island 101 and completely surrounds the display unit 200, the encapsulation layer 300 may contact an exposed portion of the first insulating layer 204 or the second insulating layer 206 via the trench T' and thus may effectively reduce or prevent infiltration of external moisture and/or oxygen.

Figure 9:
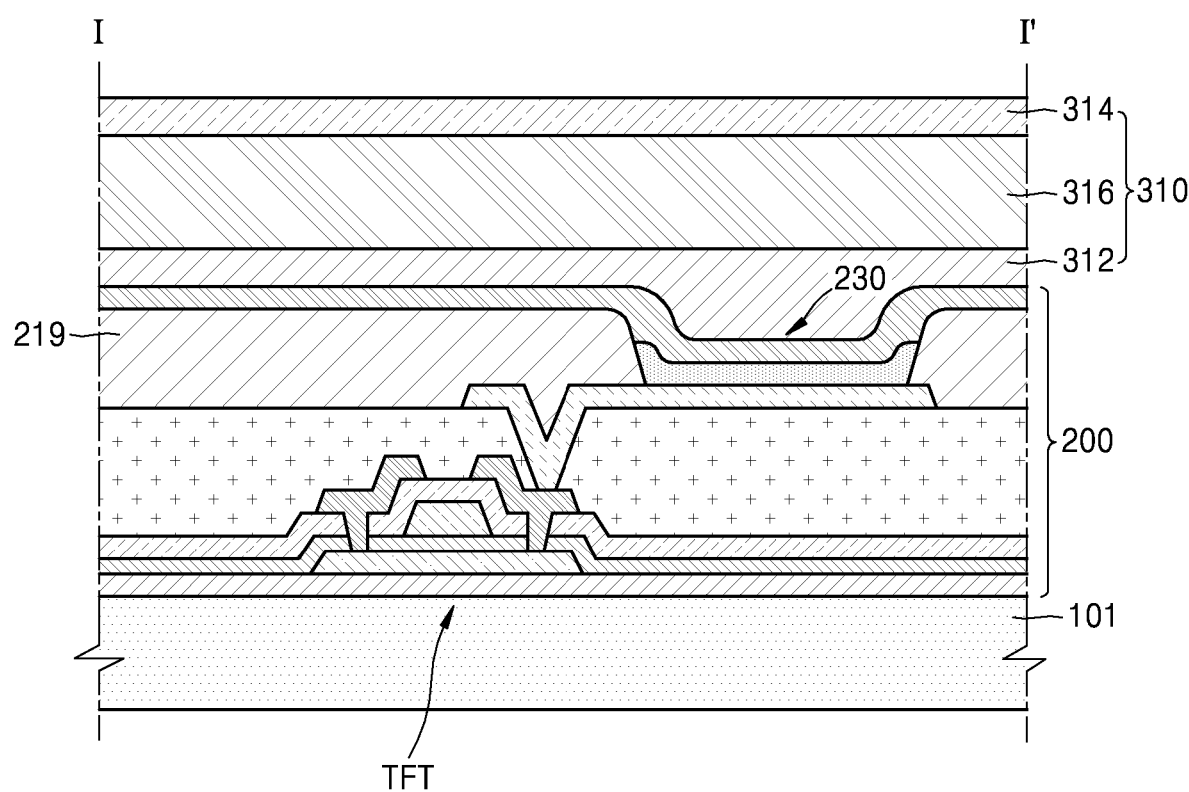
FIG. 9 is a cross-sectional view taken along line I-I' of FIG. 3, according to another embodiment.
Figure 10:
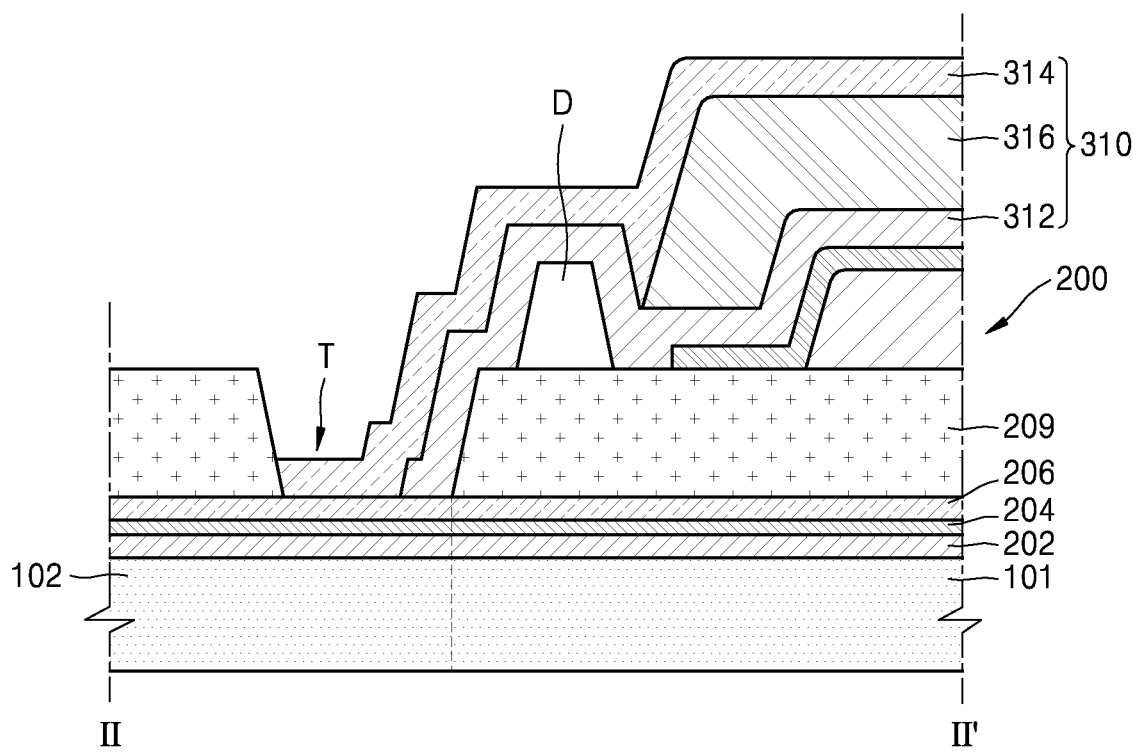
FIG. 10 is a cross-sectional view taken along line II-II' of FIG. 3, according to another embodiment.
Figure 11:
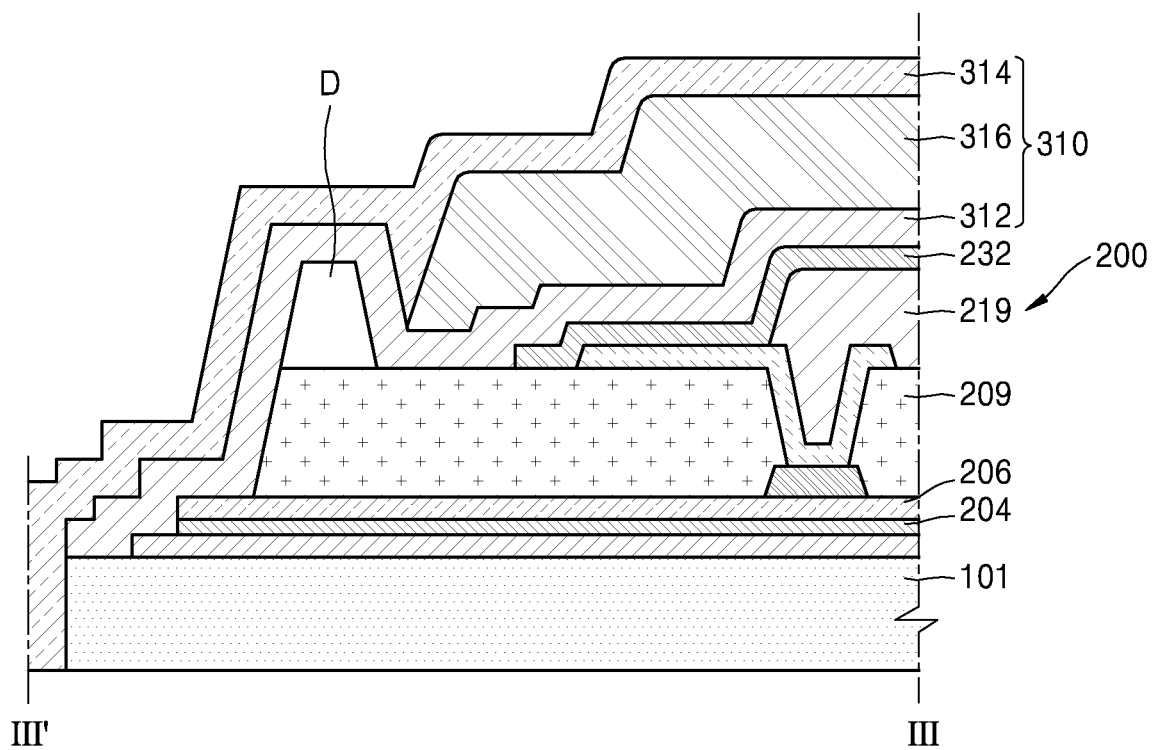
FIG. 11 is a cross-sectional view taken along line III-III' of FIG. 3, according to another embodiment.

FIG. 9 is a cross-sectional view taken along line I-I' of FIG. 3 FIG. 10 is a cross-sectional view taken along line II-II' of FIG. 3, and FIG. 11 is a cross-sectional view taken along line III-III' of FIG. 3, according to another embodiment.

Referring to FIGS. 3 and 9-11, a display unit 200 and an encapsulation layer 310 are formed on an island 101. The display unit 200 may include at least one organic light-emitting device 230 and a thin film transistor TFT that is electrically connected to the organic light-emitting device 230. Since the island 101 and the display unit 200 are the same as those described above with reference to FIGS. 1-8, repeated descriptions thereof may be omitted, and only differences therebetween will now be focused.

One encapsulation layer 310 may be formed on one island 101 to encapsulate one display unit 200.

The encapsulation layer 310 may include, for example, at least one inorganic layer (i.e., inorganic layers 312 and 314) and at least one organic layer (i.e., an organic layer 316) that are alternately stacked one on another. Although the encapsulation layer 310 includes the two inorganic layers 312 and 314 and the single organic layer 316 in FIGS. 9-11, embodiments of the present disclosure are not limited thereto. For example, the encapsulation layer 310 may further include a plurality of additional inorganic layers and a plurality of additional organic layers that are alternately stacked one on another, and the number of stacked inorganic layers and the number of stacked organic layers are not limited. As described above with reference to FIG. 4, the encapsulation layer 310 may be formed of an LVT inorganic material or may include a layer formed of an LVT inorganic material.

According to an embodiment, the inorganic layers 312 and 314 may include at least one selected from a group including silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The organic layer 316 may planarize steps caused by the pixel defining layer 219 and may reduce stress generated on the inorganic layers 312 and 314. According to an embodiment, the organic layer 316 may include at least one selected from a group including PMMA, PC, PS, acryl-based resin, epoxy-based resin, polyimide, and polyethylene.

According to anther embodiment, the organic layer 316 may include silicon oxide including carbon and oxygen (hereinafter, referred to as SiOCH). For example, the organic layer 316 may be formed of a material having a composition formula of $SiO_xC_yH_z$.

When the organic layer 316 is formed of SiOCH, the organic layer 316 may be formed by forming a precursor film on the first inorganic layer 312 via plasma enhanced chemical vapor deposition (PECVD) by using a raw material gas (e.g., hexamethyldisiloxane) and a reaction gas (e.g., oxygen) and then plasma-curing the precursor film. The organic layer 316 and the inorganic layers 312 and 314 may be formed using the same method within the same chamber to reduce a tack time during formation of the encapsulation layer 310.

According to another embodiment, at least one of the inorganic layers 312 and 314 may include SiOCH. For example, at least one of the inorganic layers 312 and 314 may include a material having a composition formula of $SiO_{x'}C_{y'}H_{z'}$.

When the organic layer 316 and at least one of the inorganic layers 312 and 314 are all formed of SiOCH, a composition ratio of SiOCH used to form the at least one of the inorganic layers 312 and 314 may be different from that of SiOCH used to form the organic layer 316. In detail, since a film formed of SiOCH has a similar property to an inorganic layer as an oxygen content ratio increases and a carbon content ratio decreases, oxygen content of SiOCH used to form at least one of the inorganic layers 312 and 314 may be more than that of SiOCH used to form the organic layer 316, and carbon content of SiOCH used to form at least one of the inorganic layers 312 and 314 may be less than that of SiOCH used to form the organic layer 316.

The oxygen and carbon contents of SiOCH may be adjusted during production of an SiOCH film. For example, the SiOCH film may be formed via PECVD by using a raw material gas (e.g., hexamethyldisiloxane) and a reaction gas (e.g., oxygen). In this case, when a flow ratio of oxygen as a reaction gas is increased, the oxygen content of the SiOCH film may be increased and the carbon content thereof may be decreased.

As such, when the organic layer 316 and at least one of the inorganic layers 312 and 314 are all formed of SiOCH, the inorganic layers 312 and 314 and the organic layer 316 may be consecutively formed within the same chamber by simply adjusting the flow rate of the reaction gas, leading to an improvement in the manufacturing efficiency of the encapsulation layer 310.

According to one embodiment, the inorganic layers 312 and 314 may have larger areas than the organic layer 316. The inorganic layers 312 and 314 may contact each other, around the organic layer 316. At least one of the inorganic layers 312 and 314 may contact the inorganic layer of the display unit 200 in the non-display region of the display unit 200. In this case, the inorganic layer may be the buffer layer 202, the first insulating layer 204, or the second insulating layer 206. At least one of the inorganic layers 312 and 314 may further extend beyond the island 101 and may contact a lateral surface of the island 101. Accordingly, bonding strength of the encapsulation layer 310 may improve, and the encapsulation layer 310 may effectively prevent infiltration of external moisture and/or oxygen into the display unit 200.

The buffer layer 202, the first insulating layer 204, the second insulating layer 206, and the passivation layer 209 of the display unit 200 may be formed on the connection unit 102, and the passivation layer 209 on the connection unit 102 may include a trench T exposing a portion of the first insulating layer 204 or the second insulating layer 206 under the passivation layer 209. In this case, at least one of the inorganic layers 312 and 314 may contact the exposed portion of the first insulating layer 204 or the second insulating layer 206 via the trench T.

According to another embodiment, a dam unit D surrounding at least a portion of the display region DA of the display unit 200 may be formed in the non-display region of the display unit 200.

For example, the dam unit D may include a first layer formed of the material used to form the passivation layer 209, and a second layer formed of the material used to form the pixel defining layer 219. However, embodiments of the present disclosure are not limited thereto, and the dam unit D may include a single layer. According to some embodiments, a plurality of dam units D may be included. When a plurality of dam units D are included, each of the dam units D has a height increasing in a direction toward the edge of the island 101.

The dam unit D may include the same material used to form at least one of the layers between the first insulating layer 204 and the pixel defining layer 219.

During formation of the organic layer 316 of the encapsulation layer 310, the dam unit D may block an organic material or the like used to form the organic layer 316 from flowing toward the edge of the island 101, thereby preventing formation of an edge tail of the organic layer 316. Thus, the organic layer 316 may face or contact an inner surface of the dam unit D. As another example, the organic layer 316 may overlap a portion of the dam unit D, but may not extend beyond the dam unit D.

However, the first inorganic layer 312 and the second inorganic layer 314 may contact each other around the dam unit D, and at least one of the first inorganic layer 312 and the second inorganic layer 314 may contact an exposed portion of the first insulating layer 204 or the second insulating layer 206 via the trench T and may also contact a lateral surface of the island 101. Accordingly, bonding strength of the encapsulation layer 310 may improve, and the encapsulation layer 310 may effectively prevent infiltration of external moisture and/or oxygen into the display unit 200.

Figure 12:
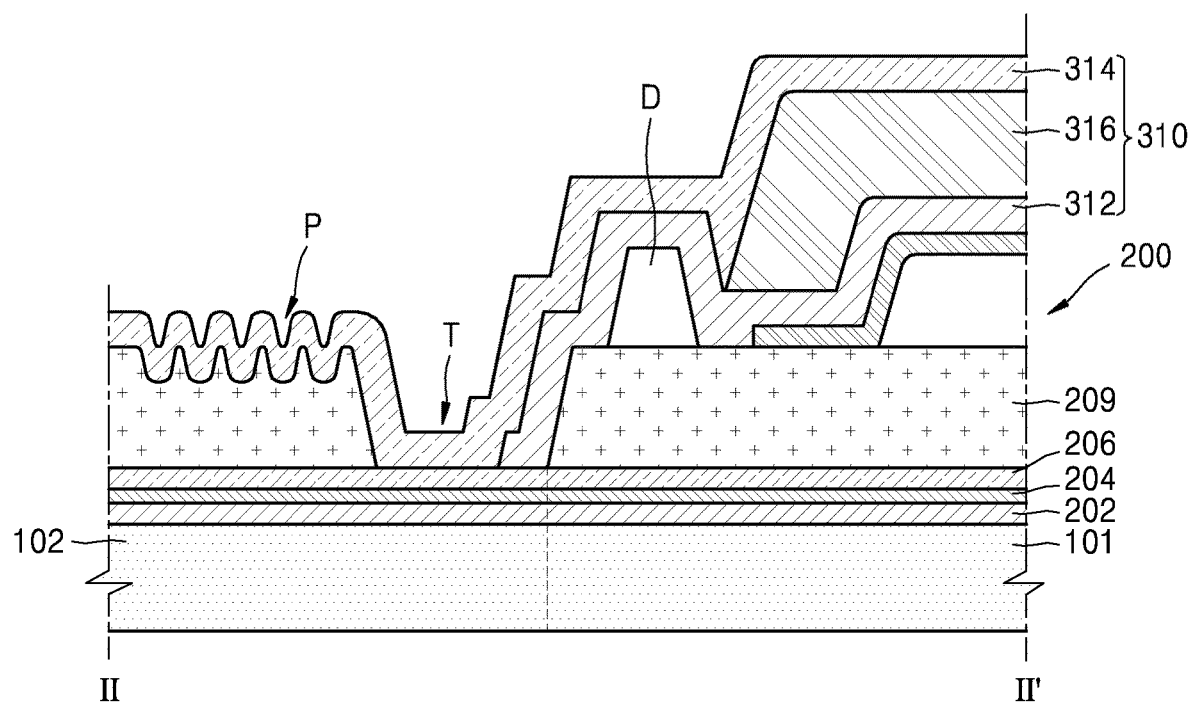
FIG. 12 is a cross-sectional view taken along line II-II' of FIG. 3, according to another embodiment.

FIG. 12 is a cross-sectional view taken along line II-II' of FIG. 3, according to another embodiment.

Referring to FIG. 12, a display unit 200 may be formed on the island 101. The display unit 200 may include the thin film transistor TFT of FIG. 4 including inorganic layers and the organic light-emitting device 230 of FIG. 4 that is electrically connected to the thin film transistor TFT. The passivation layer 209 may be interposed between the thin film transistor TFT and the organic light-emitting device 230. The inorganic layers of the thin film transistor TFT may be the first insulating layer 204 and the second insulating layer 206.

The buffer layer 202, the first insulating layer 204, the second insulating layer 206, and the passivation layer 209 formed on the island 101 may extend over the connection unit 102. The passivation layer 209 on the connection unit 102 may include a trench T exposing a portion of the first insulating layer 204 or the second insulating layer 206 under the passivation layer 209.

At least one of the inorganic layers 312 and 314 of the encapsulation layer 310 may contact the exposed portion of the first insulating layer 204 or the second insulating layer 206 via the trench T.

According to one embodiment, a dam unit D surrounding at least a portion of the display region DA of the display unit 200 may be formed in the non-display region of the display unit 200. The organic layer 316 may face or contact an inner surface of the dam unit D or may overlap a portion of the dam unit D, but may not extend beyond the dam unit D. However, the inorganic layers 312 and 314 may cover the dam unit D and may contact each other around the dam unit D.

According to one embodiment, an outermost inorganic layer of the encapsulation layer 310 may extend over the connection unit 102. For example, when the encapsulation layer 310 includes the two inorganic layers 312 and 314, the second inorganic layer 314 on the outermost side of the encapsulation layer 310 may be formed on both the island 101 and the connection unit 102.

In other words, the passivation layer 209 formed on the connection unit 102 may be covered with the second inorganic layer 314. Since the passivation layer 209 may be formed of an organic material as described above, when the passivation layer 209 formed on the connection unit 102 is covered with the second inorganic layer 314 formed of an inorganic material, exposure of a surface of the passivation layer 209 to oxygen or moisture may be prevented, and thus infiltration of oxygen or moisture into the display unit 200 via the passivation layer 209 may be prevented.

According to one embodiment, flexures P may be formed on at least a portion of the region on the connection unit 102. For example, the flexures P may be formed by patterning the passivation layer 209. As another example, the flexures P may be formed using various methods, such as, by forming steps or the like on the connection unit 102. A method of forming the flexures P is not limited thereto.

The flexures P may be formed at a location corresponding to the connection region C of FIG. 3 where the island 101 and the connection unit 102 are connected to each other. The flexures P may reduce stress that may concentrate on a connecting portion between the connection unit 102 and the island 101 during elongation of the substrate 10 of FIG. 1. The flexures P may prevent the second inorganic layer 314 extending over the connection unit 102 from being damaged, for example, cracked.

Figure 13:
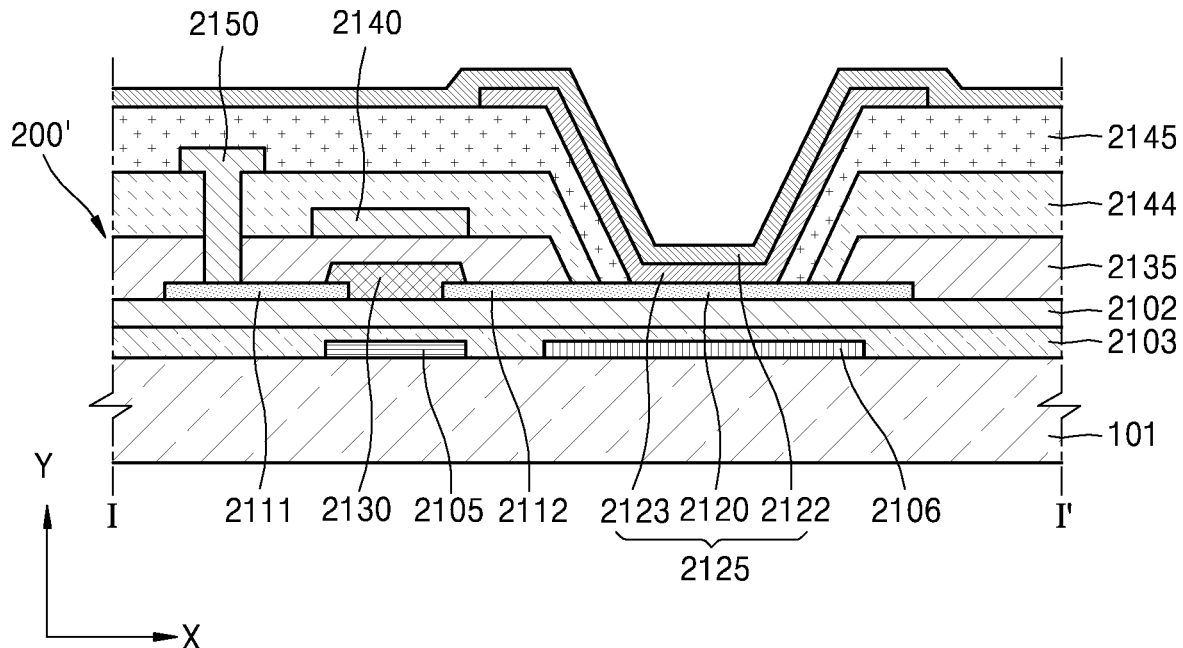
FIG. 13 is a cross-sectional view taken along line I-I' of FIG. 3, according to another embodiment.

FIG. 13 is a cross-sectional view taken along line I-I' of FIG. 3, according to another embodiment.

Referring to FIG. 13, a display unit 200' may be disposed on the island 101, and may include a source electrode 2111, a drain electrode 2112, an active layer 2130, an organic light-emitting device 2125, a gate electrode 2140, a light protection layer 2105, a color filter 2106, and an auxiliary electrode 2150. For convenience of explanation, FIG. 13 does not show an encapsulation layer on the display unit 200'. However, the display unit 200' may be encapsulated by an encapsulation layer.

The island 101 may include the same material as the materials mentioned in the previous embodiments. A buffer layer 2102 may be formed on the island 101.

The source electrode 2111 and the drain electrode 2112 may be formed on the buffer layer 2102. A first electrode 2120 of the organic light-emitting device 2125 may also be formed on the buffer layer 2102. In other words, the first electrode 2120 may extend from the source electrode 2111 or the drain electrode 2112. In other words, the first electrode 2120 may include the same material used to form the source electrode 2111 or the drain electrode 2112, and may be integrally formed with the source electrode 2111 or the drain electrode 2112. Thus, process efficiency of the display unit 200' may improve.

The active layer 2130 may be formed on the source electrode 2111 and the drain electrode 2112. The active layer 2130 corresponds to a space between the source electrode 2111 and the drain electrode 2112.

According to another embodiment, the active layer 2130 may contact the source electrode 2111 and the drain electrode 2112, and, in particular, may contact respective lateral surfaces of the source electrode 2111 and the drain electrode 2112 that face each other. For example, the active layer 2130 may contact a lateral surface facing the drain electrode 2112 from among the lateral surfaces of the source electrode 2111 and may contact a lateral surface facing the source electrode 2111 from among the lateral surfaces of the drain electrodes 2112. According to another embodiment, the active layer 2130 may contact a portion of the upper surface of the source electrode 2111 and a portion of the upper surface of the drain electrode 2112. Accordingly, contact areas between the active layer 2130 and the source electrode 2111 and the drain electrode 2112 increase, and thus a short channel structure may be implemented.

The active layer 2130 may include various materials. For example, the active layer 2130 may include an oxide semiconductor material. According to another embodiment, the active layer 2130 may include a ZnO-based oxide. According to yet another embodiment, the active layer 2130 may include an oxide semiconductor material containing In, Ga, and/or Sn.

According to yet another embodiment, the active layer 2130 may include G-I-Z-O [$(In_2O_3)a(Ga_2O_3)b(ZnO)c$], wherein a, b, and c are real numbers that respectively satisfy a≥0, b≥0, and c>0.

According to yet another embodiment, the active layer 2130 may include an oxide of a material selected from Group 12, 13, and 14 metal elements (e.g., zinc (Zn), indium (In), gallium (Ga), stannum (Sn), cadmium (Cd), germanium (Ge), and hafnium (Hf)), and a combination thereof.

The gate electrode 2140 has a region that overlaps at least a portion of the active layer 2130. The gate electrode 2140 may include various highly-conductive materials. According to another embodiment, the gate electrode 2140 may include a low resistance metal material, for example, molybdenum (Mo), aluminum (Al), copper (Cu), or titanium (Ti).

A first insulation layer 2135 is formed between the gate electrode 2140 and the active layer 2130. The first insulation layer 2135 electrically insulates the gate electrode 2140 from the active layer 2130.

The first insulating layer 2135 may not cover at least one region of the first electrode 2120. According to another embodiment, the first insulating layer 2135 may cover at least an edge of the first electrode 2120.

The gate electrode 2140 is formed on the first insulating layer 2135. The first insulating layer 2135 may include various insulating materials. For example, the first insulating layer 2135 may include an inorganic material, such as silicon oxide, silicon nitride, or aluminum oxide. As another example, the first insulating layer 2135 may include an organic material including a polymer.

A second insulation layer 2144 is formed on the gate electrode 2140. The second insulating layer 2144 covers the gate electrode 2140. The second insulating layer 2144 is formed on the first insulating layer 2135. The second insulating layer 2144 may not cover at least one region of the first electrode 2120.

According to another embodiment, the second insulating layer 2144 may cover the first insulating layer 2135, in a region corresponding to an upper surface of the first electrode 2120.

According to another embodiment, at least a portion of the first insulating layer 2135 may be exposed without being covered with the second insulating layer 2144, in the region corresponding to the upper surface of the first electrode 2120.

The second insulating layer 2144 may include various insulating materials. For example, the second insulating layer 2144 may include an inorganic material, such as silicon oxide, silicon nitride, or aluminum oxide. As another example, the second insulating layer 2144 may include an organic material including a polymer.

The auxiliary electrode 2150 may be formed on the second insulating layer 2144. The auxiliary electrode 2150 contacts at least a portion of one of the source electrode 2111 and the drain electrode 2112. The first insulating layer 2135 and the second insulating layer 2144 may expose at least one region of at least one of the source electrode 2111 and the drain electrode 2112, and the auxiliary electrode 2150 may contact the exposed region.

The auxiliary electrode 2150 may not face at least a portion of the entire region of the first electrode 2120 that is not covered with the first insulating layer 2135 and the second insulating layer 2144.

The auxiliary electrode 2150 improves electrical characteristics of the source electrode 2111 and the drain electrode 2112. In particular, when the source electrode 2111 and the drain electrode 2112 are formed of a light transmitting material, electrical resistances of the source electrode 2111 and the drain electrode 2112 may increase. This problem may be compensated by forming the auxiliary electrode 2150 of a material having low resistivity to improve electrical properties of the source electrode 2111 and the drain electrode 2112.

The auxiliary electrode 2150 may include various conductive materials, for example, a highly-conductive metal material. According to another embodiment, the auxiliary electrode 2150 may include Cu, Ag, Al, Mo, or Au. According to one embodiment, the auxiliary electrode 2150 is formed to be spaced apart from the active layer 2130 to prevent a component of the auxiliary electrode 2150 from being diffused into the active layer 2130 and damaging the active layer 2130.

According to one embodiment, the auxiliary electrode 2150 may be formed on a different level from the level of the gate electrode 2140 on the second insulating layer 2144, thereby minimizing interference in the gate electrode 2140 and enabling precise patterning of the gate electrode 2140 and the auxiliary electrode 2150. However, according to another embodiment, the auxiliary electrode 2150 may be formed on the first insulating layer 2135 on the same level as that of the gate electrode 2140.

A passivation layer 2145 is formed on the second insulating layer 2144. The passivation layer 2145 covers the auxiliary electrode 2150. The passivation layer 2145 may not cover at least one region of the first electrode 2120.

According to one embodiment, the passivation layer 2145 may cover the second insulating layer 2144 in the region corresponding to the upper surface of the first electrode 2120. According to another embodiment, at least a portion of the second insulating layer 2144 may be exposed without being covered with the passivation layer 2145 in the region corresponding to the upper surface of the first electrode 2120.

The passivation layer 2145 may be a single layer formed of an organic material, or may be a multi-layer structure including a plurality of organic material layers. The organic material may include a commercial polymer such as PMMA or PS, a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. The passivation layer 2145 may be a stack of an inorganic insulation layer and an organic insulation layer.

The first insulating layer 2135, the second insulating layer 2144, and the passivation layer 2145 may also be formed on the connection unit 102 of FIG. 3. The first insulating layer 2135 or the second insulating layer 2144 may be exposed via the trench T of FIG. 3. The exposed first insulating layer 2135 or the exposed second insulating layer 2144 may contact the encapsulation layer 300 of FIG. 3.

An intermediate layer 2123 is formed on an upper surface of the first electrode 2120. The intermediate layer 2123 may include an organic emission layer to generate visible light. The intermediate layer 2123 may generate various colors of lights. In other words, the intermediate layer 2123 may generate red (R), green (G), and blue (B) lights, for example. According to another embodiment, the intermediate layer 2123 may generate white (W) light.

A second electrode 2122 is formed on the intermediate layer 2123. The second electrode 2122 may include various conductive materials, for example, Li, Ca, LiF/Ca, LiF/Al, Al, Mg, and Ag.

The light protection layer 2105 faces the active layer 2130. The light protection layer 2105 may face a surface opposite to a surface facing the gate electrode 2140 among the surfaces of the active layer 2130. Accordingly, the active layer 2130 may be prevented from being damaged by light.

According to one embodiment, an over-coating layer 2103 may be formed on a substrate to cover the light protection layer 2105. The over-coating layer 2103 may be formed below the buffer layer 2102.

The color filter 2106 faces at least one region of the first electrode 2120. In detail, the color filter 2106 may face a region of the first electrode 2120 that is overlapped by the intermediate layer 2123. The color filter 2106 may be disposed between the first electrode 2120 and the substrate.

According to one embodiment, the color filter 2106 may be formed on the substrate, and the over-coating layer 2103 may be formed to cover the color filter 2106. The over-coating layer 2103 may be formed below the buffer layer 2102.

The color filter 2106 may face the first electrode 2120, and thus a display apparatus generating various colors may be realized.

While the color filter 2106 is being formed, the light protection layer 2105 may also be formed of a color filter material based on one color, for example, a red (R) color. In other words, after the light protection layer 2105 and the color filter 2106 are formed on the substrate, the over-coating layer 2103 may be formed to cover the light protection layer 2105 and the color filter 2106.

Figure 14:
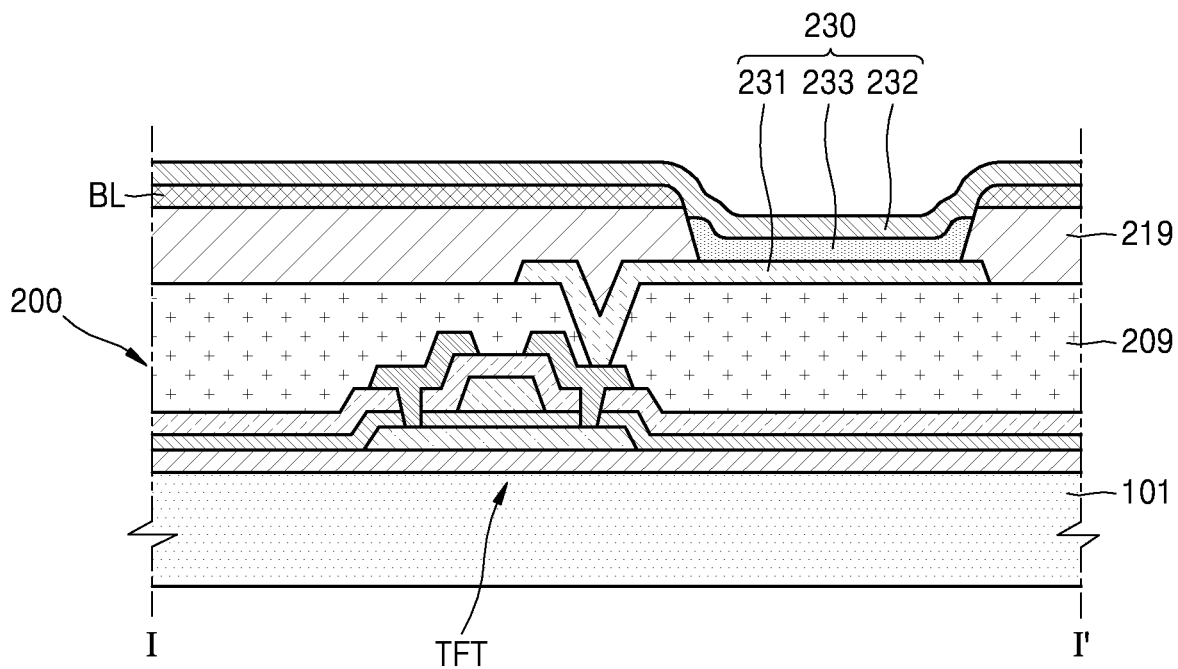
FIG. 14 is a cross-sectional view taken along line I-I' of FIG. 3, according to yet another embodiment.

FIG. 14 is a cross-sectional view taken along line I-I' of FIG. 3, according to yet another embodiment.

Referring to FIGS. 3 and 14, a display unit 200 may be disposed on the island 101, and may include at least one organic light-emitting device 230 and a thin film transistor TFT that is electrically connected to the organic light-emitting device 230. The organic light-emitting device 230 may include a first electrode 231, an intermediate layer 233, and a second electrode 232. A passivation layer 209 may be disposed between the organic light-emitting device 230 and the thin film transistor TFT. For convenience of explanation, FIG. 14 does not show an encapsulation layer on the display unit 200. However, the display unit 200 may be encapsulated by an encapsulation layer.

A pixel defining layer 219 exposes an area of the first electrode 231 and defines a pixel region of the organic light-emitting device 230. A light blocking layer BL may be disposed on a remaining region except for the pixel region defined by the pixel defining layer 219.

For example, when the display unit 200 is of a top-emission type, the light blocking layer BL may be formed on an upper surface of the pixel defining layer 219. However, embodiments are not limited thereto, and the pixel defining layer 219 or the passivation layer 209 may include a material that is capable of blocking light. On the other hand, when the display unit 200 is of a bottom-emission type, the light blocking layer BL may be disposed between the island 101 and the thin film transistor TFT.

Figure 15:
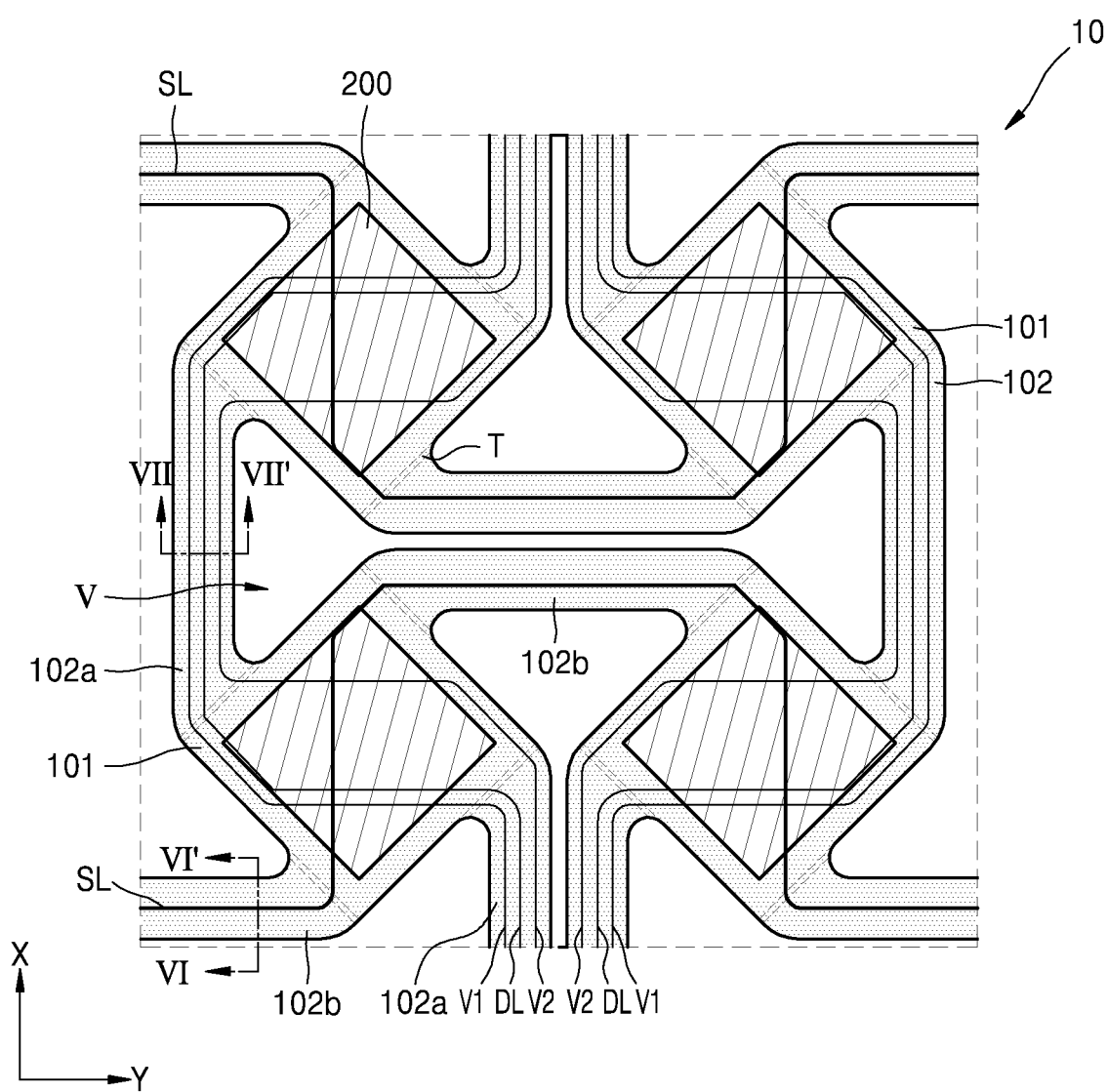
FIG. 15 is a magnified plan view of a portion A of FIG. 1.
Figure 16:
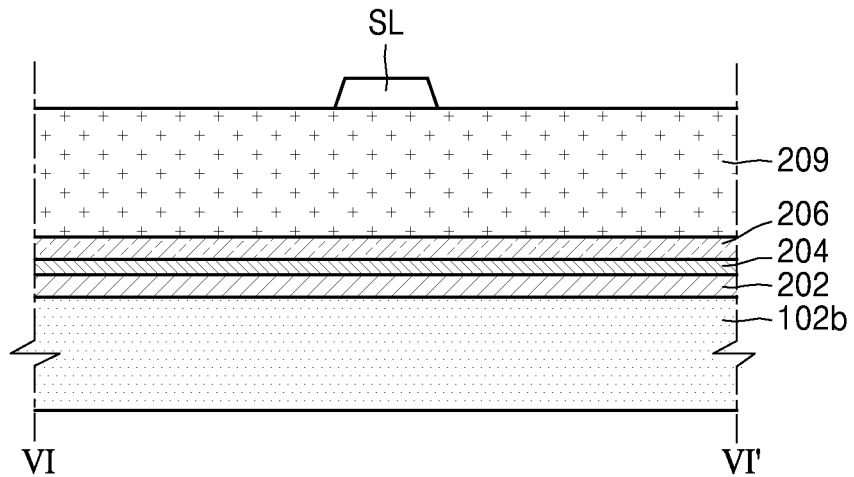
FIG. 16 is a cross-sectional view taken along line VI-VI' of FIG. 15, according to an embodiment.

FIG. 15 is a magnified plan view of a portion A of FIG. 1. FIG. 16 is a cross-sectional view taken along line VI-VI' of FIG. 15, and FIG. 17 is a cross-sectional view taken along line VII-VII' of FIG. 15, according to an embodiment.

Figure 17:
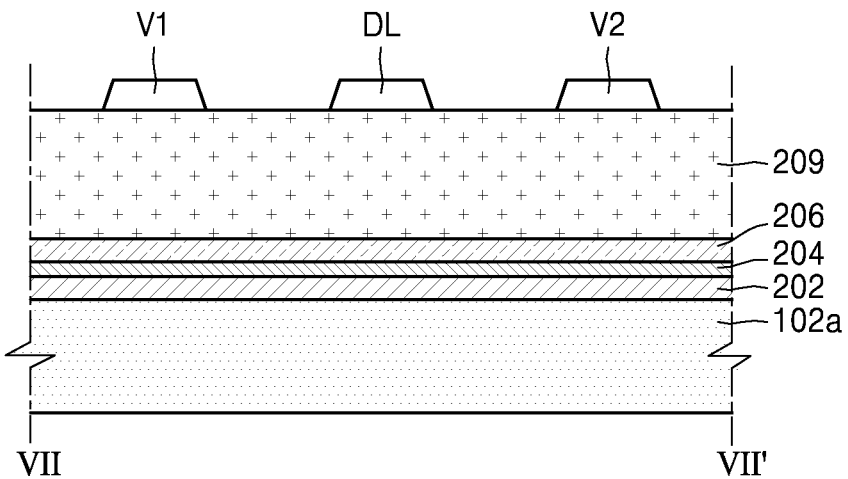
FIG. 17 is a cross-sectional view taken along line VII-VII' of FIG. 15, according to an embodiment.

Referring to FIGS. 15-17, the display apparatus 10 may include a plurality of islands 101, a plurality of connection units 102 that are connecting the plurality of islands 101 to one another, and a plurality of display units 200 respectively disposed on the plurality of islands 101. Inorganic layers and a passivation layer 209 of the display units 200 may be consecutively formed on the islands 101 and the connection units 102. The inorganic layers may be the buffer layer 202, the first insulating layer 204, and the second insulating layer 206 included in the thin film transistor TFT of FIG. 4, respectively.

Each of the plurality of display units 200 may be encapsulated by the encapsulation layer 300 of FIG. 4. The encapsulation layer 300 may contact an exposed portion of the first insulating layer 204 or the second insulating layer 206 via the trench T.

Four connection units 102 are connected to one island 101. In detail, a pair of first connection units 102a positioned on opposite sides of one island 101 and each extending in the first direction X, and a pair of second connection units 102b positioned on opposite sides of the island 101 and each extending in the second direction Y may be connected to the island 101.

A first wiring unit may be positioned on the two first connection units 102a, and a second wiring unit may be positioned on the two second connection units 102b. For example, the first wiring unit may include a first voltage line V1, a second voltage line V2, and at least one data line DL, and the second wiring unit may include at least one scan line SL.

The first wiring unit and the second wiring unit may cross each other on the island 101.

The first wiring unit may extend in the first direction X and may include a region curved along a through hole V in the second direction Y. Since the first wiring unit may extend in the first direction X and may repeat a curved shape at regular intervals, non-uniformity of brightness or the like between the display units 200 due to the first wiring unit may be reduced or prevented. A plurality of first wiring units extending in the same direction may be formed not to overlap each other to thereby minimizing interferences therebetween.

Similarly, since the second wiring unit may extend in the second direction Y, and a curved shaped in the first direction X may be repeated at regular intervals, non-uniformity of brightness or the like between the display units 200 due to the second wiring unit may be reduced or prevented. A plurality of second wiring units extending in the same direction may be formed not to overlap each other to thereby minimizing interferences therebetween.

The first wiring unit and the second wiring unit may include the same material. For example, the first wiring unit and the second wiring unit may have a stacked structure of Ti/Al/Ti and may include the same material used to form the source electrode 207 and the drain electrode 208, which are highly flexible.

FIG. 16 illustrates an example in which a scan line SL is formed on a second connection unit 102b. The buffer layer 202, the first insulating layer 204, the second insulating layer 206, and the passivation layer 209 may be sequentially stacked on the second connection unit 102b in the stated order, and the scan line SL may be formed on the passivation layer 209. Since the scan line SL is connected to the gate electrode 205 of the thin film transistor to apply a scan signal to the thin film transistor, the scan line SL and the gate electrode 205 of the thin film transistor may be electrically connected to each other via a contact hole.

FIG. 17 illustrates an example in which the first voltage line V1, the data line DL, and the second voltage line V2 are formed on a first connection unit 102a. The buffer layer 202, the first insulating layer 204, the second insulating layer 206, and the passivation layer 209 may be sequentially stacked on the first connection unit 102a in the stated order, and the first voltage line V1, the data line DL, and the second voltage line V2 may be formed on the passivation layer 209.

The data line DL may be connected to the drain electrode 208 of the thin film transistor to apply a data signal to the thin film transistor. The first voltage line V1 may electrically connect first electrodes 231 of FIG. 4 respectively included in a plurality of display units 200 and separated from one another to one another.

According to embodiments of the present disclosure, since the plurality of display units 200 respectively include separated second electrodes 232 of FIG. 4, to electrically connect the separated second electrodes 232 to one another, the second voltage line V2 may have the same pattern as or a similar pattern to the first voltage line V1, and the second voltage line V2 may be electrically connected to the second electrode 232 via a contact hole.

Figure 18:
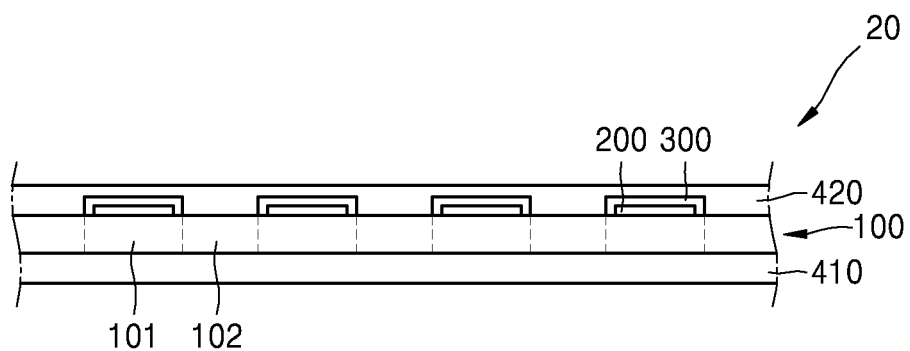
FIG. 18 is a schematic cross-sectional view of a display apparatus, which is a modification of the display apparatus of FIG. 1.

FIG. 18 is a schematic cross-sectional view of a display apparatus 20, which is a modification of the display apparatus 10 of FIG. 1.

Referring to FIG. 18, the display apparatus 20 may include a substrate 100 including a plurality of islands 101 and a plurality of connection units 102 that are connecting the plurality of islands 101 to one another, a plurality of display units 200 respectively disposed on the plurality of islands 101, a plurality of encapsulation layers 300 respectively encapsulating the plurality of display units 200, and a first protection film 410 and a second protection film 420 respectively disposed on an upper surface and a lower surface of the substrate 100. The substrate 100 may include a plurality of through holes V of FIG. 1 that penetrate through the substrate 100 between the connection units 102.

Since the substrate 100, the display unit 200, and the encapsulation layer 300 are the same as those described above in the previous embodiments, repeated descriptions thereof may be omitted herein.

The first protection film 410 and the second protection film 420 may prevent external foreign materials or the like from permeating the display apparatus 20. The first protection film 410 and the second protection film 420 are formed of elongation sheets, and thus may be elongated or changed in shape when the display apparatus 20 is elongated or changed in shape. For example, the first protection film 410 and the second protection film 420 may be biaxially oriented polypropylene films, biaxially oriented polyethylene terephthalate films, or the like. According to another embodiment, the first protection film 410 and the second protection film 420 may include, but is not limited to, polydimethylsiloxane (PDMS).

Figure 19:
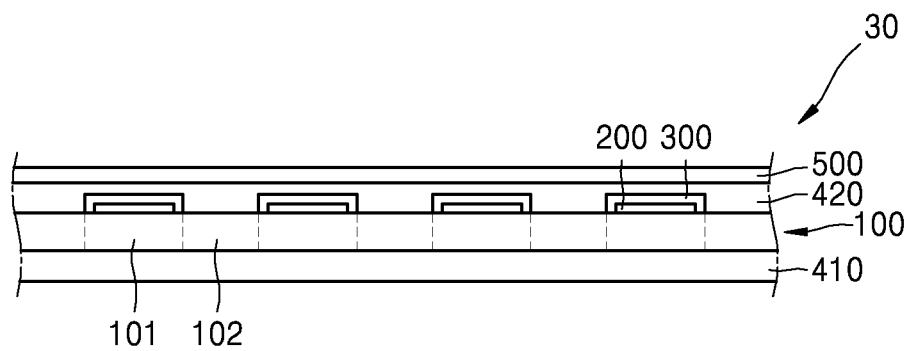
FIG. 19 is a schematic cross-sectional view of a display apparatus, which is another modification of the display apparatus of FIG. 1.

FIG. 19 is a schematic cross-sectional view of a display apparatus 30, which is another modification of the display apparatus 10 of FIG. 1.

Referring to FIG. 19, the display apparatus 30 may include a substrate 100, a plurality of display units 200 disposed on the substrate 100, a plurality of encapsulation layers 300 respectively encapsulating the plurality of display units 200, a first protection film 410 and a second protection film 420 respectively disposed on an upper surface and a lower surface of the substrate 100, and a functional layer 500 on the second protection film 420.

The substrate 100 may include a plurality of islands 101, a plurality of connection units 102 that are connecting the plurality of islands 101 to one another, and a plurality of through holes V penetrating through the substrate 100 between the plurality of connection units 102.

The plurality of display units 200 may be respectively disposed on the plurality of islands 101. The encapsulation layers 300, respectively encapsulating the plurality of display units 200, may also be disposed on the plurality of islands 101.

As described above with reference to FIG. 18, the first protection film 410 and the second protection film 420 may prevent external foreign materials or the like from permeating the display apparatus 30.

The functional layer 500 may include at least one of a polarization layer and a touch screen layer. The functional layer 500 may further include an optic film for external light reflection and a protection layer. The functional layer 500 is elongatable, and may be elongated when the display apparatus 30 is elongated.

Figure 20:
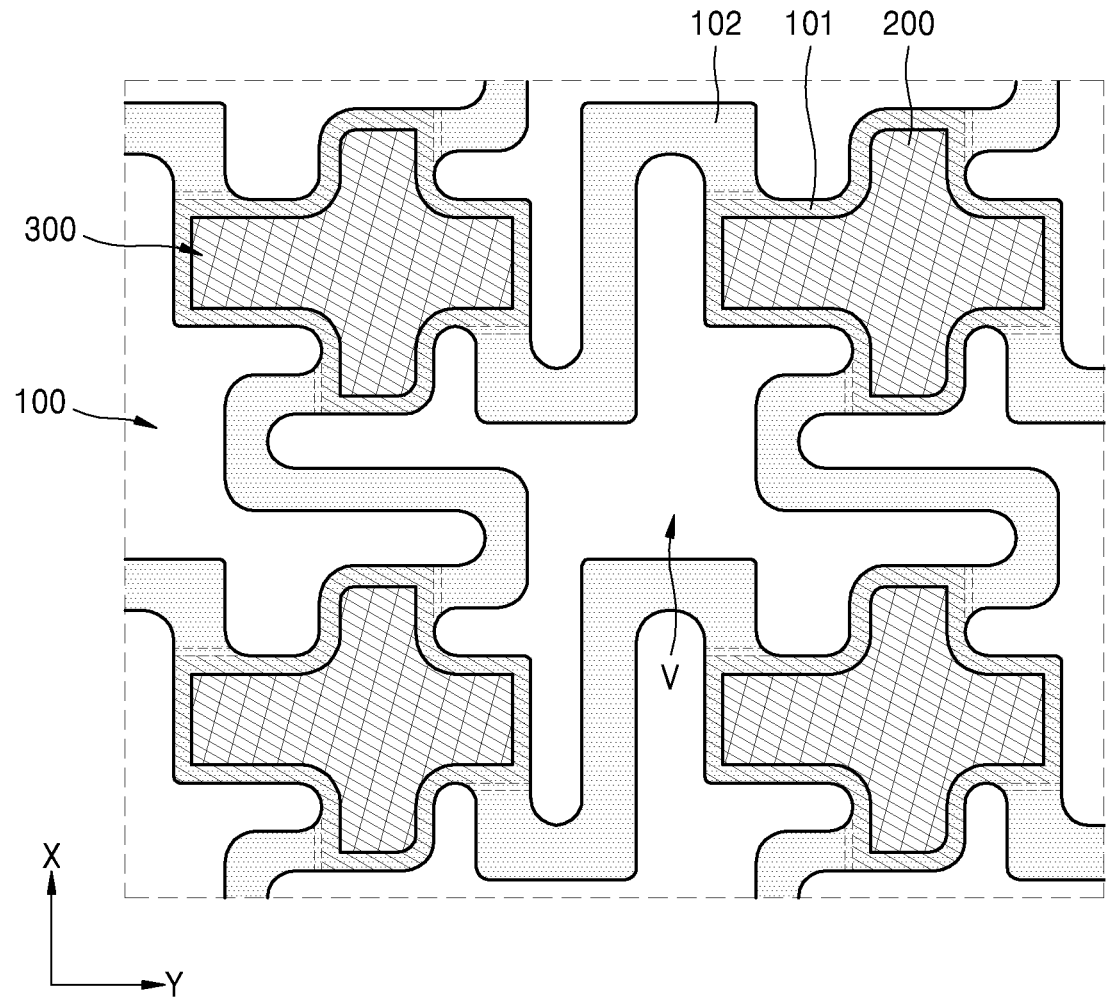
FIG. 20 is a magnified plan view of a portion A of FIG. 1, according to another embodiment.

FIG. 20 is a magnified plan view of a portion A of FIG. 1, according to another embodiment.

Referring to FIG. 20, the substrate 100 may include a plurality of islands 101 spaced apart from one another, a plurality of connection units 102 that are connecting the plurality of islands 101 to one another, and a plurality of through holes V penetrating through the substrate 100 between the plurality of connection units 102.

A plurality of display units 200 may be disposed on the plurality of islands 101, respectively. Each display unit 200 may include at least a display device to realize visible light. The display device may be an organic light-emitting device. The plurality of display units 200 may be independently encapsulated by a plurality of encapsulation layers 300.

The plurality of connection units 102 may connect the plurality of islands 101 to one another. For example, four connection units 102 are connected to each of the plurality of islands 101 and extend adjacent to the island 101 in different directions, and thus the four connection units 102 may be respectively connected to other four adjacent islands 101 surrounding the island 101.

The plurality of islands 101 and the plurality of connection units 102 may be formed of the same material and may be connected to each other. In other words, the plurality of islands 101 and the plurality of connection units 102 may be integrally formed to have one body.

The inorganic layers and the passivation layer 209 of FIG. 4 of the display units 200 may be consecutively formed on the islands 101 and the connection units 102. The inorganic layers may include the buffer layer 202 and the first insulating layer 204 and the second insulating layer 206 included in the thin film transistor TFT of FIG. 4, The encapsulation layer 300 may contact an exposed portion of the first insulating layer 204 or the second insulating layer 206 via the trench T. Accordingly, the encapsulation layer 300 may reduce or prevent infiltration of external moisture and oxygen into the display units 200 via the passivation layer 209 that may be formed of an organic material.

Wiring units that are electrically connected to the display units 200 may be disposed on the plurality of islands 101.

Referring to FIG. 20, each connection unit 102 has at least one curved portion. Accordingly, the shape of the at least one curved portion changes when the substrate 100 is elongated, and intervals between the plurality of islands 101 may increase. Thus, the shape of the display apparatus 10 of FIG. 1 may change two-dimensionally or three-dimensionally.

The through holes V penetrate through the substrate 100. The through holes V may provide separation areas between the plurality of islands 101, reduce the weight of the substrate 100, and improve the flexibility of the substrate 100. When the substrate 100 is bent, rolled, or the like, the shapes of the through holes V change, and thus stress generated during deformation of the substrate 100 is effectively reduced. Thus, abnormal deformation of the substrate 100 may be prevented, and durability of the substrate 100 may improve. Accordingly, convenience and usability of the display apparatus 10 may improve, and the display apparatus 10 may be suitably applied to bending display apparatuses, flexible display apparatuses, or stretchable display apparatuses.

According to embodiments of the present disclosure, even when the shape of a display apparatus changes, an encapsulation layer may be prevented from being damaged, and infiltration of external moisture and oxygen may be effectively prevented, thereby improving the reliability of the display apparatus. It should be understood that the scope of the present disclosure is not restricted by this effect.

It should be understood that embodiments described herein should be considered in a descriptive sense and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure.

What is claimed is:

1. A display apparatus comprising:
a substrate comprising a plurality of islands spaced apart from one another, a plurality of connection units that are connecting the plurality of islands to one another, and a plurality of through holes penetrating through the substrate between the plurality of connection units;
a display device to emit light, the display device comprising a first electrode, an intermediate layer comprising an emission layer, and a second electrode which are disposed on at least one of the plurality of islands;
at least one inorganic layer and at least one organic layer disposed between the substrate and the display device; and
an encapsulation layer encapsulating the display device, the encapsulation layer comprising at least one inorganic encapsulating layer and at least one organic encapsulating layer;
wherein the at least one inorganic layer and the at least one inorganic encapsulating layer contact each other along an edge of the at least one of the plurality of islands.

2. The display apparatus of claim 1, further comprising a dam unit surrounding the display device,
wherein the dam unit is disposed between the second electrode and a position at which the at least one inorganic layer and the at least one inorganic encapsulating layer contact each other.

3. The display apparatus of claim 2, further comprising a pixel defining layer that covers edge portions of the first electrode.

4. The display apparatus of claim 3, wherein the second electrode on the pixel defining layer extends toward the dam unit and an end portion of the second electrode is disposed between the dam unit and the pixel defining layer.

5. The display apparatus of claim 3, wherein the dam unit comprises a same material with the pixel defining layer.

6. The display apparatus of claim 3, wherein the at least one organic layer is disposed between the substrate and the pixel defining layer.

7. The display apparatus of claim 2, wherein the at least one organic layer is disposed on the at least one inorganic layer,
wherein the at least one organic layer comprises a groove along the edge of the at least one of the plurality of islands to expose a portion of the at least one inorganic layer, and
wherein the at least one inorganic encapsulating layer contacts the exposed portion of the at least one inorganic layer at the groove.

8. The display apparatus of claim 7, wherein the groove forms a closed loop along the edge of the at least one of the plurality of islands.

9. The display apparatus of claim 1, wherein the at least one organic layer is disposed over the at least one inorganic layer, and the at least one organic layer and the at least one inorganic layer extend over the at least one of the connection units.

10. The display apparatus of claim 9, wherein the at least one organic layer comprises a groove to expose a portion of the at least one inorganic layer between the at least one of the connection units and the second electrode, and
wherein the at least one inorganic encapsulating layer contacts the exposed portion of the at least one inorganic layer at the groove.

11. The display apparatus of claim 9, further comprising a plurality of wirings on the at least one organic layer of the at least one of the connection units,
wherein the plurality of wirings electrically connects the display device.

12. The display apparatus of claim 2, wherein the encapsulation layer comprises a first inorganic encapsulating layer, a second inorganic encapsulating layer, and an organic encapsulating layer between the first inorganic encapsulating layer and the second inorganic encapsulating layer, and
wherein the first inorganic encapsulating layer and the second inorganic encapsulating layer contact each other outside the dam unit.

13. The display apparatus of claim 3, wherein the dam unit comprises a first layer and a second layer on the first layer, and
wherein the first layer comprises a same material with the at least one organic layer and the second layer comprises a same material with the pixel defining layer.

14. The display apparatus of claim 1, further comprises a thin film transistor electrically connected to the display device,
wherein the at least one organic layer covers the thin film transistor, and
wherein the at least one inorganic layer comprises a first insulating layer between an active layer and a gate electrode of the thin film transistor, and a second insulating layer disposed on the gate electrode.

15. The display apparatus of claim 1, further comprises a color filter comprising a portion overlapped by the first electrode.

16. The display apparatus of claim 1, further comprising a first protection film and a second protection film respectively disposed on an upper surface and a lower surface of the substrate,
wherein the first protection film and the second protection film comprise elongation sheets.

* * * * *